United States Patent
Hiyoshi et al.

(10) Patent No.: US 9,722,027 B2
(45) Date of Patent: Aug. 1, 2017

(54) SILICON CARBIDE SEMICONDUCTOR DEVICE AND METHOD FOR MANUFACTURING THE SAME

(71) Applicant: Sumitomo Electric Industries, Ltd., Osaka-shi (JP)

(72) Inventors: Toru Hiyoshi, Osaka (JP); Keiji Wada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/909,696

(22) PCT Filed: Jun. 25, 2014

(86) PCT No.: PCT/JP2014/066820
§ 371 (c)(1),
(2) Date: Feb. 2, 2016

(87) PCT Pub. No.: WO2015/019732
PCT Pub. Date: Feb. 12, 2015

(65) Prior Publication Data
US 2016/0181374 A1    Jun. 23, 2016

(30) Foreign Application Priority Data

Aug. 6, 2013  (JP) .................................. 2013-163343
Oct. 1, 2013   (JP) .................................. 2013-206525

(51) Int. Cl.
*H01L 21/02*    (2006.01)
*H01L 29/16*    (2006.01)
(Continued)

(52) U.S. Cl.
CPC .... *H01L 29/1608* (2013.01); *H01L 21/02164* (2013.01); *H01L 21/02236* (2013.01);
(Continued)

(58) Field of Classification Search
CPC .......... H01L 29/1608; H01L 29/66068; H01L 29/1602; H01L 29/7802; H01L 29/6606;
(Continued)

(56) References Cited

U.S. PATENT DOCUMENTS

2006/0220026 A1* 10/2006 Uchida ................. H01L 21/049
257/77
2009/0096020 A1    4/2009 Yamanobe
(Continued)

FOREIGN PATENT DOCUMENTS

JP    2009-099714 A    5/2009
JP    2011-129547 A    6/2011
(Continued)

OTHER PUBLICATIONS

Hull et al., "Performance of 60 A, 1200 V 4H-SiC DMOSFETs," Materials Science Forum vols. 615-617, 2009, 749-752.
(Continued)

*Primary Examiner* — Dale E Page
*Assistant Examiner* — Long H Le
(74) *Attorney, Agent, or Firm* — Venable LLP; Michael A. Sartori; F. Brock Riggs

(57) ABSTRACT

A silicon carbide semiconductor device includes a silicon carbide substrate and a gate electrode. The silicon carbide substrate includes a first source region and a second source region, a first body region, a second body region, a first drift region, a second drift region, a third drift region, and a first connection region. The first connection region is provided to include a first intersection and a second intersection, the first intersection being an intersection of a straight line along a first straight-line portion and a straight line along a second straight-line portion, the second intersection being an intersection of a straight line along a third straight-line portion
(Continued)

and a straight line along a fourth straight-line portion, and the first connection region has a second conductivity type.

17 Claims, 15 Drawing Sheets

(51) Int. Cl.
*H01L 29/08* (2006.01)
*H01L 29/06* (2006.01)
*H01L 29/02* (2006.01)
*H01L 29/66* (2006.01)
*H01L 29/78* (2006.01)
*H01L 29/10* (2006.01)
*H01L 29/739* (2006.01)
*H01L 29/423* (2006.01)

(52) U.S. Cl.
CPC ........ *H01L 29/0696* (2013.01); *H01L 29/086* (2013.01); *H01L 29/0865* (2013.01); *H01L 29/0869* (2013.01); *H01L 29/1095* (2013.01); *H01L 29/42368* (2013.01); *H01L 29/66068* (2013.01); *H01L 29/66712* (2013.01); *H01L 29/7395* (2013.01); *H01L 29/7802* (2013.01); *H01L 21/02255* (2013.01)

(58) Field of Classification Search
CPC ......... H01L 21/02164; H01L 21/02236; H01L 29/086; H01L 29/0865; H01L 29/0869; H01L 29/1095; H01L 29/42368; H01L 29/66712; H01L 29/7395

See application file for complete search history.

(56) References Cited

U.S. PATENT DOCUMENTS

| | | | |
|---|---|---|---|
| 2011/0180814 A1* | 7/2011 | Harada | ................ H01L 21/049 257/77 |
| 2012/0193643 A1* | 8/2012 | Masuda | .............. H01L 29/1095 257/77 |
| 2013/0020586 A1 | 1/2013 | Miura et al. | |
| 2013/0062529 A1* | 3/2013 | Hall | .......................... G01T 1/24 250/370.14 |
| 2014/0239392 A1 | 8/2014 | Matsumoto et al. | |
| 2014/0353686 A1 | 12/2014 | Miura et al. | |

FOREIGN PATENT DOCUMENTS

| WO | WO-2011/135995 A1 | 11/2011 |
|---|---|---|
| WO | WO-2013-027463 A1 | 2/2013 |

OTHER PUBLICATIONS

International Search Report in International Application No. PCT/JP2014/066820, dated Sep. 16, 2014.

* cited by examiner US 9,722,027 B2

SILICON CARBIDE SEMICONDUCTOR DEVICE AND METHOD FOR MANUFACTURING THE SAME

TECHNICAL FIELD

The present invention relates to a silicon carbide semiconductor device and a method for manufacturing the same. More particularly, the present invention relates to a silicon carbide semiconductor device that can have improved switching characteristics, and a method for manufacturing the same.

BACKGROUND ART

In recent years, in order to allow a semiconductor device such as a metal oxide semiconductor field effect transistor (MOSFET) to be high in breakdown voltage and low in loss and to be used in a high-temperature environment, silicon carbide has been increasingly adopted as a material forming a semiconductor device. Silicon carbide is a wide band gap semiconductor having a band gap larger than that of silicon, which has been conventionally widely used as a material forming a semiconductor device. Hence, by adopting silicon carbide as a material forming a semiconductor device, the semiconductor device can have a high breakdown voltage, reduced on-resistance, and the like. Further, the semiconductor device thus adopting silicon carbide as its material has characteristics less deteriorated even under a high temperature environment than those of a semiconductor device adopting silicon as its material, advantageously.

For example, "Performance of 60 A, 1200V 4H—SiC DMOSFETs", by Brett A. Hull et al., Materials Science Forum, Vols. 615 to 617, 2009, pp. 749 to 752 (NPD 1) discloses a MOSFET having an n type drift layer formed on a silicon carbide substrate, a pair of well regions, and a gate insulating film. The above document discloses a MOSFET having a switching energy loss of 9 mJ when it is switched from an ON state in which a drain source current is 65 A to an OFF state in which a drain source voltage is 750 V.

CITATION LIST

Non Patent Document

NPD 1: "Performance of 60 A, 1200V 4H—SiC DMOSFETs", by Brett A. Hull et al., Materials Science Forum, Vols. 615 to 617, 2009, pp. 749 to 752

SUMMARY OF INVENTION

Technical Problem

However, in the MOSFET described in the above document, the gate insulating film is provided on the drift layer, and a gate electrode is provided on the gate insulating film. Accordingly, the MOSFET has a high electrostatic capacitance in a region sandwiched between the drift layer and the gate electrode, and thus it cannot be said that the MOSFET has sufficient switching characteristics.

The present invention has been made to solve the aforementioned problem, and one object of the present invention is to provide a silicon carbide semiconductor device that can have improved switching characteristics, and a method for manufacturing the same.

Solution to Problem

A silicon carbide semiconductor device in accordance with the present invention includes a silicon carbide substrate and a gate electrode. The silicon carbide substrate has a first main surface and a second main surface opposite to the first main surface. The gate electrode is provided on a side of the first main surface of the silicon carbide substrate. The silicon carbide substrate includes a first source region and a second source region, a first body region, a second body region, a first drift region, a second drift region, a third drift region, and a first connection region. The first source region and the second source region are adjacent to each other and have an outer shape that is a polygon when viewed in a plan view, and have a first conductivity type. The first body region is formed to surround the first source region when viewed in a plan view, and has a second conductivity type. The second body region is formed to surround the second source region when viewed in a plan view, and has the second conductivity type. The first drift region is sandwiched between the first body region and the second body region, is separated from the first source region by the first body region, is separated from the second source region by the second body region, and has the first conductivity type. The second drift region is in contact with the second body region, is separated from the second source region by the second body region, and has the first conductivity type. The third drift region is in contact with the first body region, is separated from the first source region by the first body region, and has the first conductivity type. The first body region has a first straight-line portion which is in contact with the first drift region, and a second straight-line portion which is located adjacent to the first straight-line portion and is in contact with the third drift region when viewed in a plan view. The second body region has a third straight-line portion which is in contact with the first drift region, and a fourth straight-line portion which is located adjacent to the third straight-line portion, on a side close to the second straight-line portion, and is in contact with the second drift region when viewed in a plan view. The first connection region is provided to include a first intersection and a second intersection, the first intersection being an intersection of a straight line along the first straight-line portion and a straight line along the second straight-line portion, the second intersection being an intersection of a straight line along the third straight-line portion and a straight line along the fourth straight-line portion, and the first connection region has the second conductivity type. The gate electrode is provided to overlap the first body region sandwiched between the first source region and the first drift region, the second body region sandwiched between the second source region and the first drift region, and the first connection region, when viewed in a plan view.

A method for manufacturing a silicon carbide semiconductor device in accordance with the present invention includes steps of preparing a silicon carbide substrate having a first main surface and a second main surface opposite to the first main surface, and forming a gate electrode on a side of the first main surface of the silicon carbide substrate. The silicon carbide substrate includes a first source region and a second source region, a first body region, a second body region, a first drift region, a second drift region, a third drift region, and a first connection region. The first source region and the second source region are adjacent to each other and have an outer shape that is a polygon when viewed in a plan view, and have a first conductivity type. The first body region is formed to surround the first source region when viewed in a plan view, and has a second conductivity type. The second body region is formed to surround the second source region when viewed in a plan view, and has the second conductivity type. The first drift region is sandwiched between the first body region and the second body region, is separated from the first source region by the first body region, is separated from the second source region by the second body region, and has the first conductivity type. The second drift region is in contact with the second body region, is separated from the second source region by the second body region, and has the first conductivity type. The third drift region is in contact with the first body region, is separated from the first source region by the first body region, and has the first conductivity type. The first body region has a first straight-line portion which is in contact with the first drift region, and a second straight-line portion which is located adjacent to the first straight-line portion and is in contact with the third drift region when viewed in a plan view. The second body region has a third straight-line portion which is in contact with the first drift region, and a fourth straight-line portion which is located adjacent to the third straight-line portion, on a side close to the second straight-line portion, and is in contact with the second drift region when viewed in a plan view. The first connection region is provided to include a first intersection and a second intersection, the first intersection being an intersection of a straight line along the first straight-line portion and a straight line along the second straight-line portion, the second intersection being an intersection of a straight line along the third straight-line portion and a straight line along the fourth straight-line portion, and the first connection region has the second conductivity type. In the step of forming the gate electrode, The gate electrode is formed to overlap the first body region sandwiched between the first source region and the first drift region, the second body region sandwiched between the second source region and the first drift region, and the first connection region, when viewed in a plan view.

Advantageous Effects of Invention

According to the present invention, a silicon carbide semiconductor device that can have improved switching characteristics, and a method for manufacturing the same can be provided.

DESCRIPTION OF EMBODIMENTS

Figure 1:
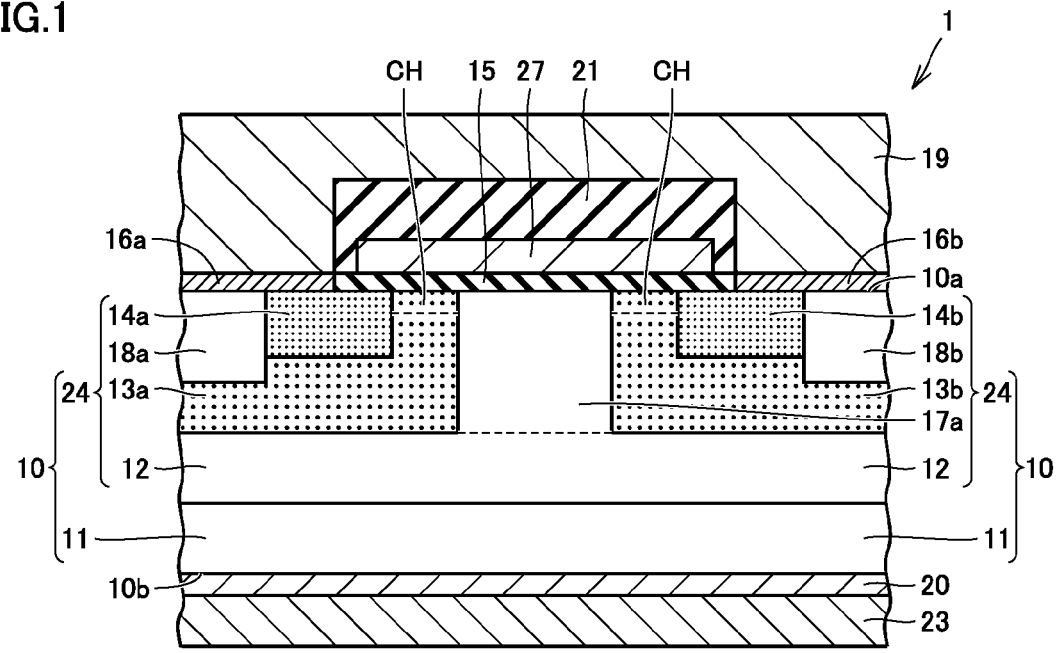
FIG. 1 is a schematic cross sectional view schematically showing a structure of a silicon carbide semiconductor device in accordance with a first embodiment of the present invention.

[Description of Embodiments of the Invention of the Present Application]

Hereinafter, embodiments of the present invention will be described with reference to the drawings. It should be noted that identical or corresponding parts in the drawings will be designated by the same reference numerals, and the description thereof will not be repeated. Regarding crystallographic indications in the present specification, an individual orientation is represented by [ ], a group orientation is represented by < >, an individual plane is represented by ( ) and a group plane is represented by { }. In addition, a negative index is supposed to be crystallographically indicated by putting "-" (bar) above a numeral, but is indicated by putting the negative sign before the numeral in the present specification. For description of an angle, a system in which an omnidirectional angle is 360 degrees is employed.

Figure 22:
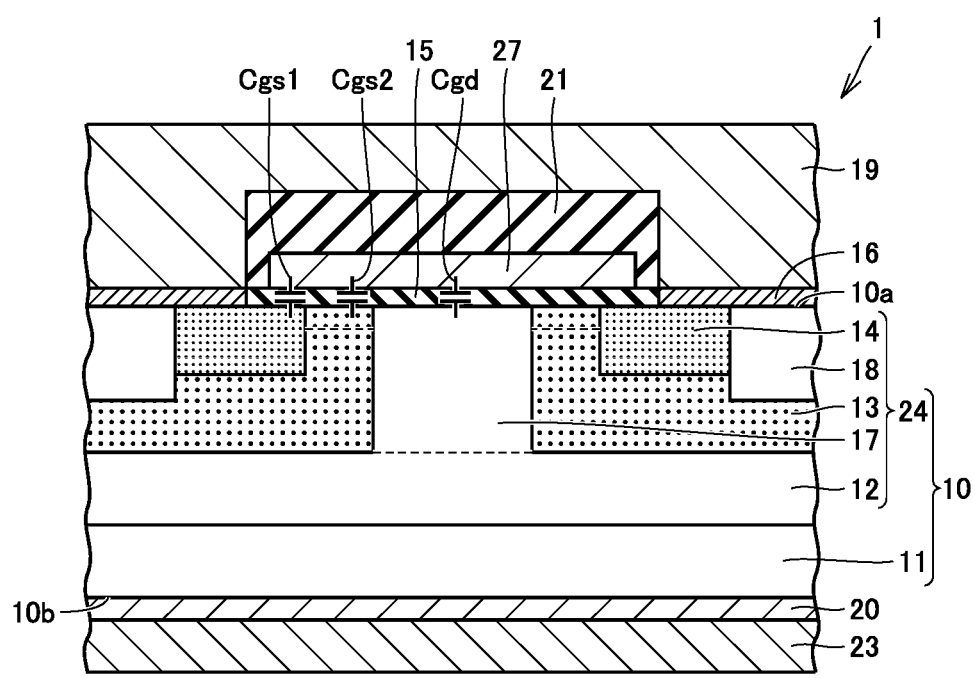
FIG. 22 is a view for illustrating electrostatic capacitances in a MOSFET.
Figure 1:
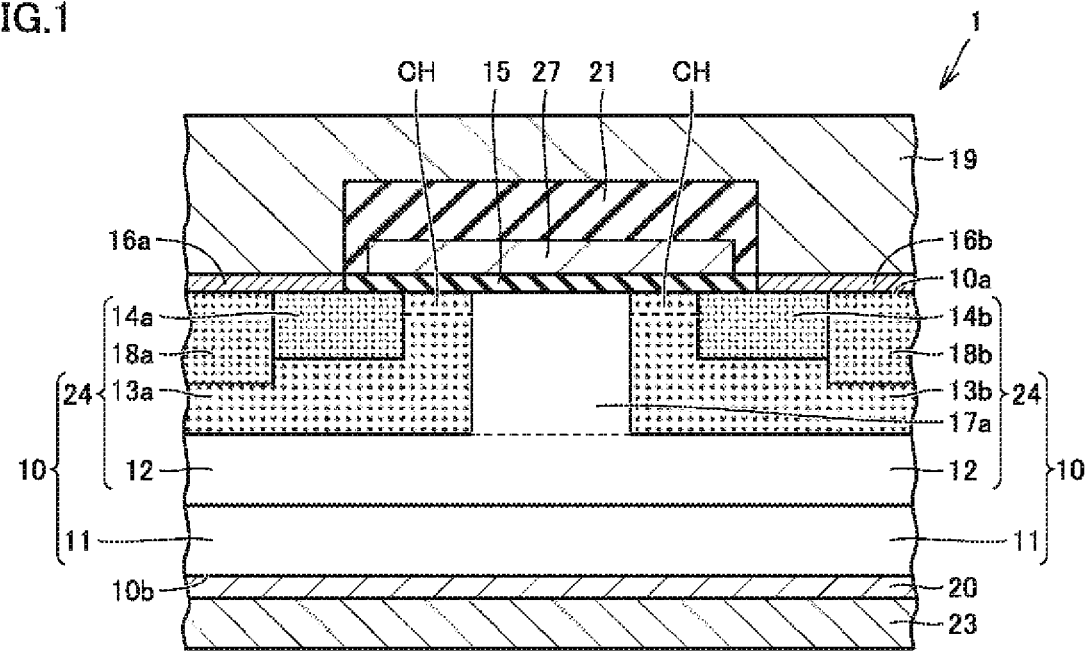
Figure 2:
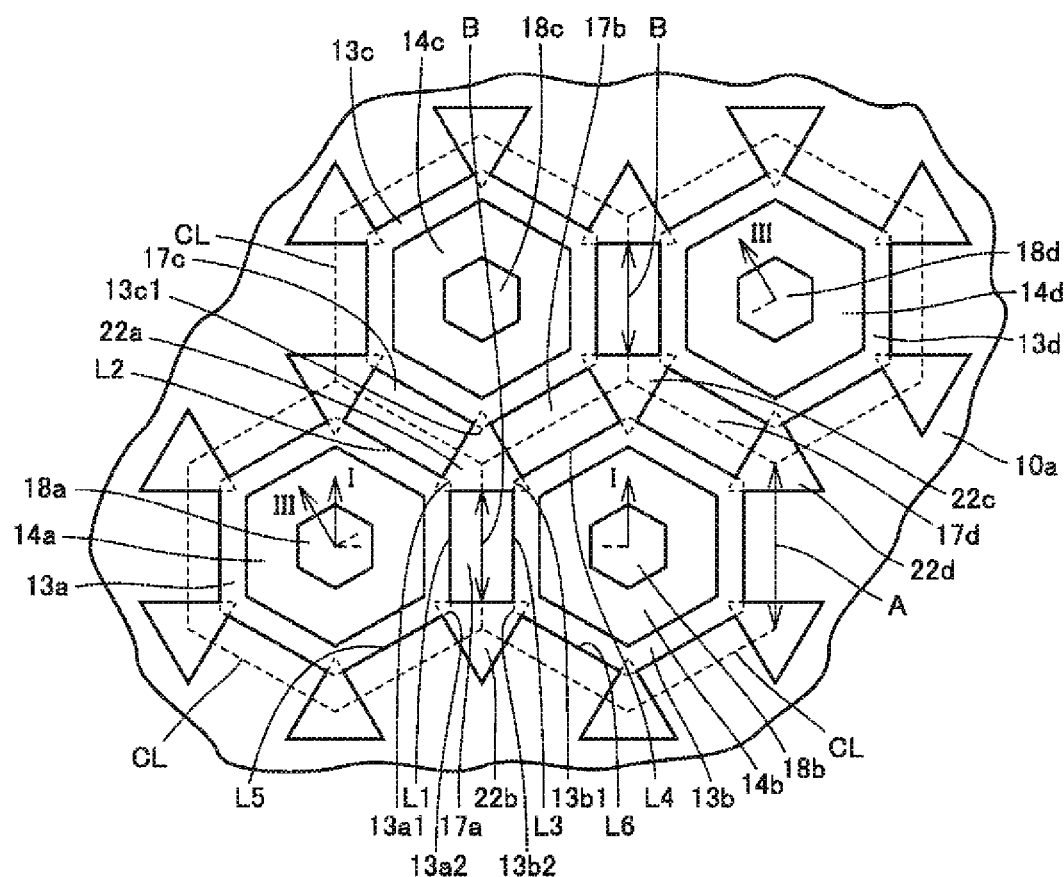
Figure 3:
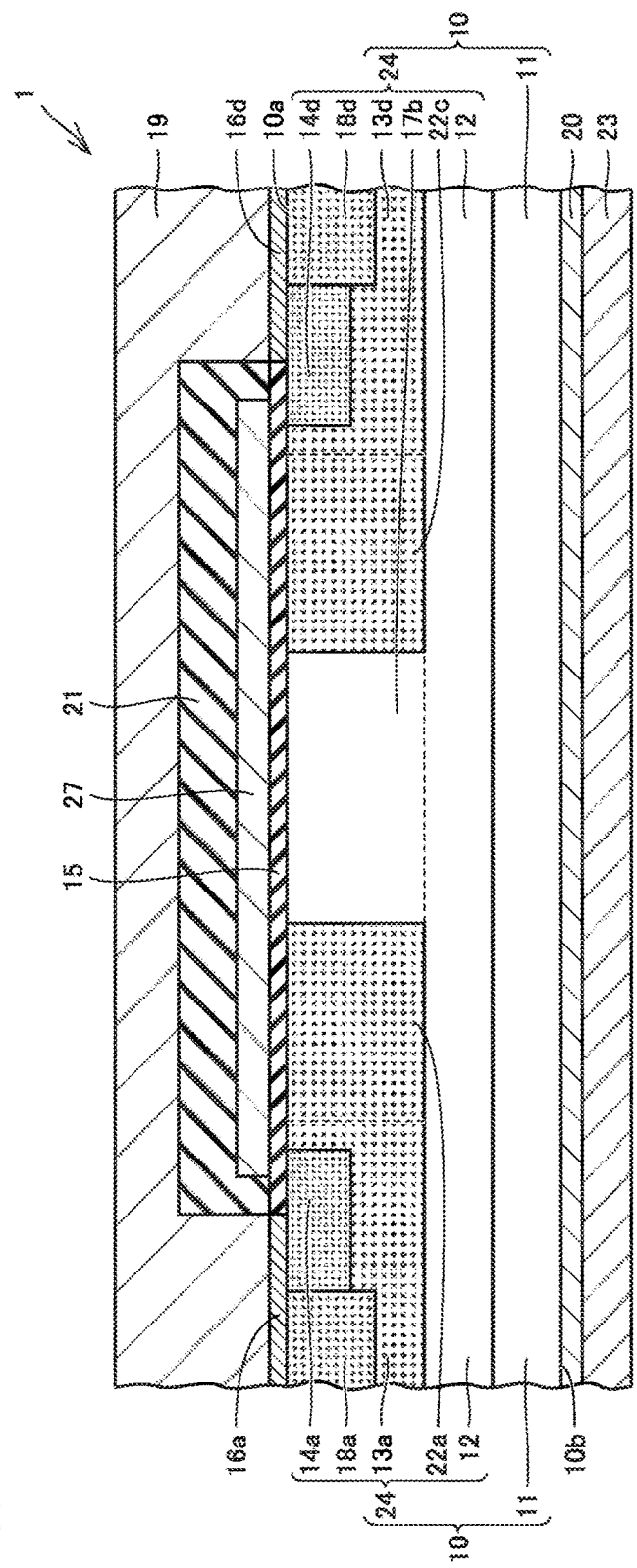
Figure 12:
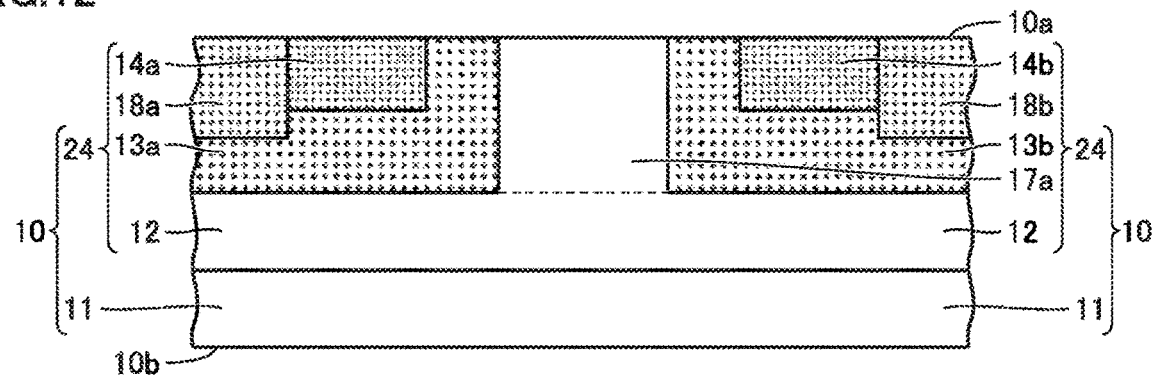
Figure 13:
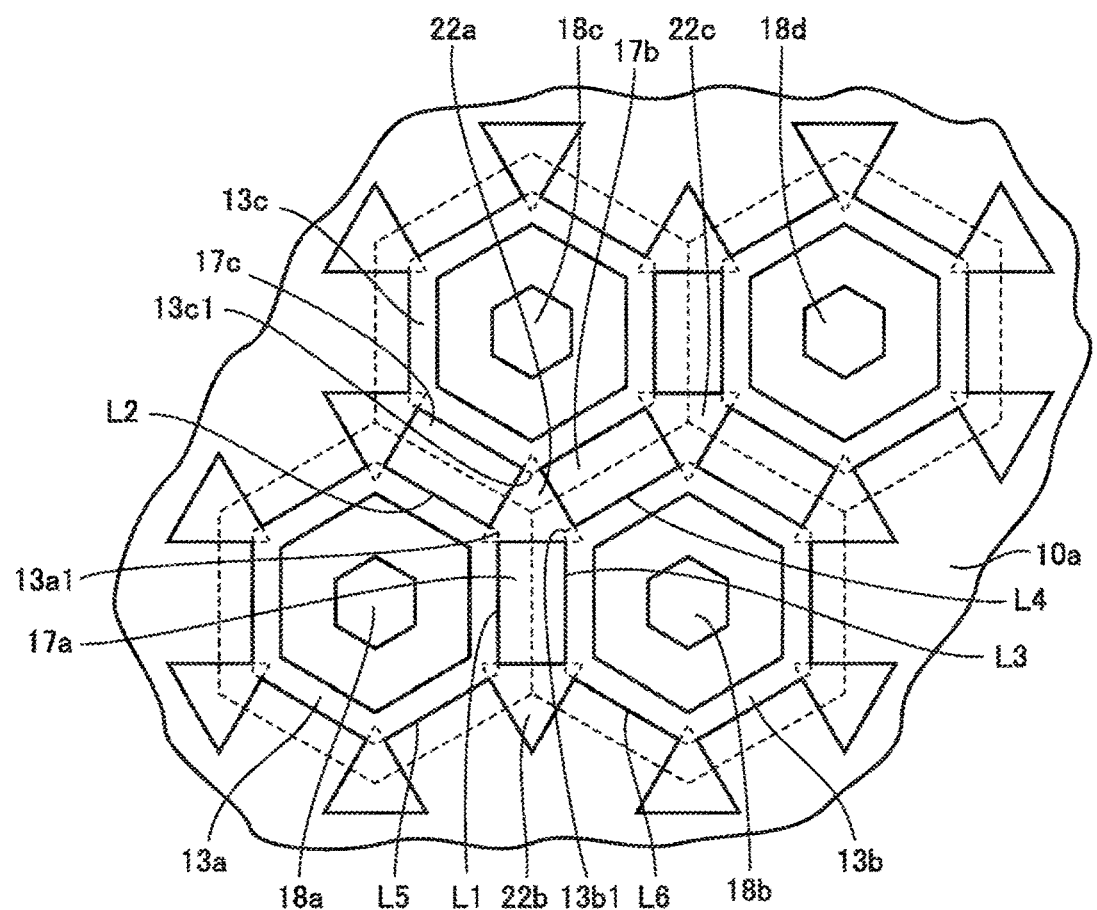
Figure 14:
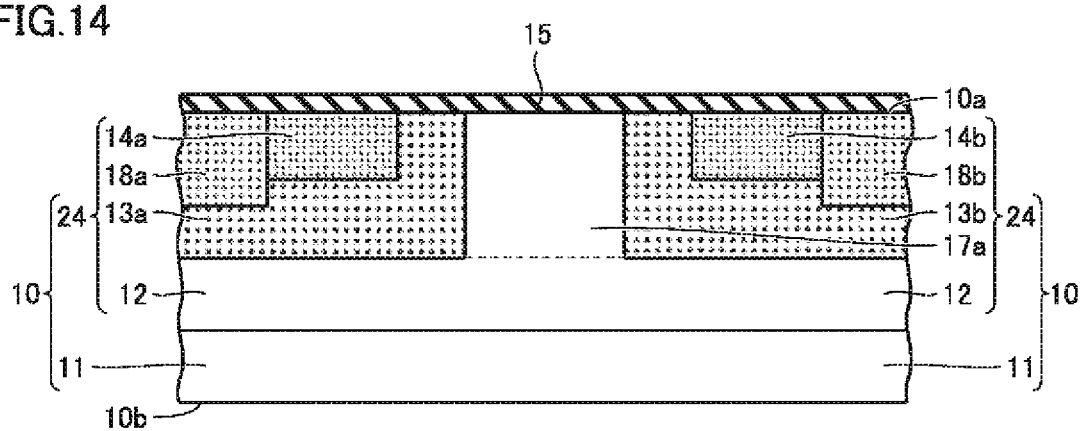
Figure 15:
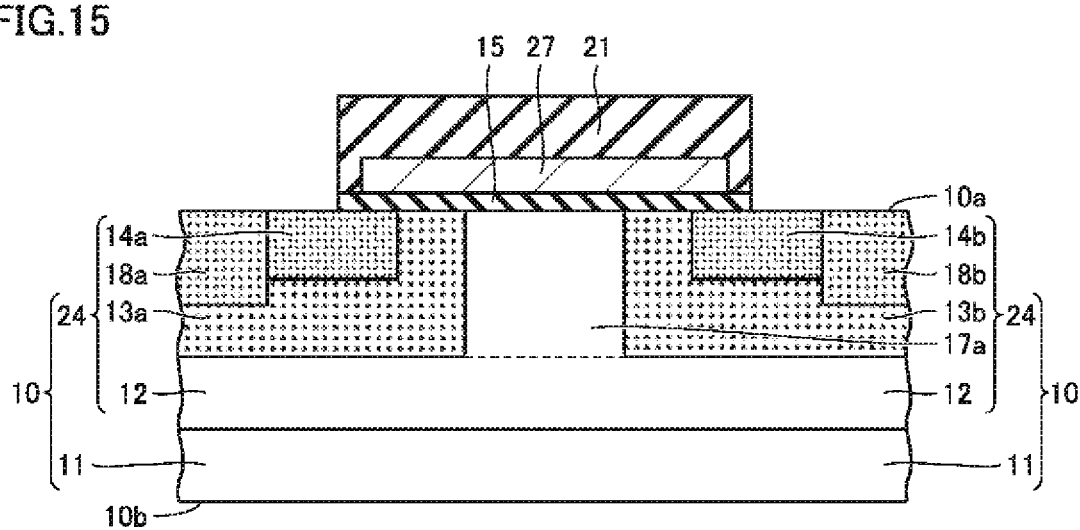
Figure 22:
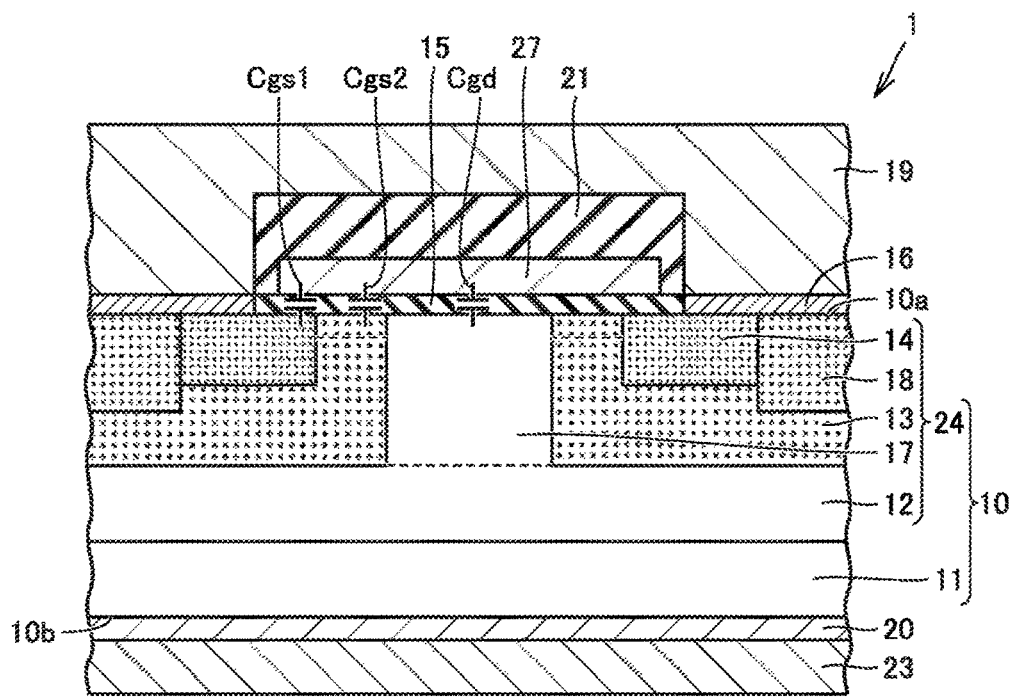

As a result of earnest studies, the inventors have obtained the following findings and found the present invention. First, in order to improve switching characteristics, it is effective to reduce the electrostatic capacitance of a silicon carbide semiconductor device. Referring to FIG. 22, electrostatic capacitances in a MOSFET include, for example, an electrostatic capacitance Cgd sandwiched between a gate electrode 27 and a drift region 17, an electrostatic capacitance Cgs1 sandwiched between gate electrode 27 and a source region 14, and an electrostatic capacitance Cgs2 sandwiched between gate electrode 27 and a body region 13. Among them, electrostatic capacitance Cgd sandwiched between the gate electrode and drift region 17 is also called a reverse transfer capacitance, and greatly affects the switching characteristics of the MOSFET. Accordingly, the switching characteristics of the MOSFET can be considerably improved by reducing electrostatic capacitance Cgd sandwiched between gate electrode 27 and drift region 17.

The inventors have found that the switching characteristics of a silicon carbide semiconductor device 1 can be improved by connecting corner portions of a plurality of body regions using a region having the same conductivity type as that of the body regions, and converting a portion of electrostatic capacitance Cgd sandwiched between the gate electrode and the drift region into electrostatic capacitance Cgs2 sandwiched between the gate electrode and the body region. Specifically, referring to FIG. 2, a first body region 13a has a first straight-line portion L1 which is in contact with a first drift region 17a, and a second straight-line portion L2 which is located adjacent to first straight-line portion L1 when viewed in a plan view. A second body region 13b has a third straight-line portion L3 which is in contact with first drift region 17a, and a fourth straight-line portion L4 which is located adjacent to third straight-line portion L3, on a side close to second straight-line portion L2, when viewed in a plan view. A first connection region 22a is provided to include a first intersection 13a1 and a second intersection 13b1, first intersection 13a1 being an intersection of a straight line along first straight-line portion L1 and a straight line along second straight-line portion L2, second intersection 13b1 being an intersection of a straight line along third straight-line portion L3 and a straight line along fourth straight-line portion L4, and first connection region 22a has p type (a second conductivity type). Gate electrode 27 is provided to overlap first body region 13a sandwiched between a first source region 14a and first drift region 17a, second body region 13b sandwiched between a second source region 14b and first drift region 17a, and first connection region 22a, when viewed in a plan view.

The inventors have found that, in silicon carbide semiconductor device 1 having the above configuration, the switching characteristics of silicon carbide semiconductor device 1 can be improved by converting a portion of electrostatic capacitance Cgd sandwiched between the gate electrode and the drift region into electrostatic capacitance Cgs2 sandwiched between the gate electrode and the body region.

(1) Silicon carbide semiconductor device 1 in accordance with an embodiment includes a silicon carbide substrate 10 and gate electrode 27. Silicon carbide substrate 10 has a first main surface 10a and a second main surface 10b opposite to first main surface 10a. Gate electrode 27 is provided on a side of first main surface 10a of silicon carbide substrate 10. Silicon carbide substrate 10 includes first source region 14a and second source region 14b, first body region 13a, second body region 13b, first drift region 17a, a second drift region 17b, a third drift region 17c, and first connection region 22a. First source region 14a and second source region 14b are adjacent to each other and have an outer shape that is a polygon when viewed in a plan view, and have a first conductivity type. First body region 13a is formed to surround first source region 14a when viewed in a plan view, and has the second conductivity type. Second body region 13b is formed to surround second source region 14b when viewed in a plan view, and has the second conductivity type. First drift region 17a is sandwiched between first body region 13a and second body region 13b, is separated from first source region 14a by first body region 13a, is separated from second source region 14b by second body region 13b, and has the first conductivity type. Second drift region 17b is in contact with second body region 13b, is separated from second source region 14b by second body region 13b, and has the first conductivity type. Third drift region 17c is in contact with first body region 13a, is separated from first source region 14a by first body region 13a, and has the first conductivity type. First body region 13a has first straight-line portion L1 which is in contact with first drift region 17a, and second straight-line portion L2 which is located adjacent to first straight-line portion L1 and is in contact with third drift region 17c when viewed in a plan view. Second body region 13b has third straight-line portion L3 which is in contact with first drift region 17a, and fourth straight-line portion L4 which is located adjacent to third straight-line portion L3, on a side close to second straight-line portion L2, and is in contact with second drift region 17b when viewed in a plan view. First connection region 22a is provided to include first intersection 13a1 and second intersection 13b1, first intersection 13a1 being an intersection of a straight line along first straight-line portion L1 and a straight line along second straight-line portion L2, second intersection 13b1 being an intersection of a straight line along third straight-line portion L3 and a straight line along fourth straight-line portion L4, and first connection region 22a has the second conductivity type. Gate electrode 27 is provided to overlap first body region 13a sandwiched between first source region 14a and first drift region 17a, second body region 13b sandwiched between second source region 14b and first drift region 17a, and first connection region 22a, when viewed in a plan view. Thereby, the switching characteristics of silicon carbide semiconductor device 1 can be improved.

(2) Preferably, in silicon carbide semiconductor device 1 in accordance with (1) described above, the polygon is a hexagon. Thereby, the cell density of silicon carbide semiconductor device 1 can be improved.

(3) Preferably, in silicon carbide semiconductor device 1 in accordance with (2) described above, first connection region 22a has a shape that is a triangle when viewed in a plan view. Thereby, the reverse transfer capacitance of silicon carbide semiconductor device 1 can be reduced effectively.

(4) Preferably, in silicon carbide semiconductor device 1 in accordance with (2) or (3) described above, silicon carbide substrate 10 further includes a third source region 14c and a third body region 13c. Third source region 14c is located adjacent to first source region 14a and second source region 14b and has an outer shape that is a hexagon when viewed in a plan view, and has the first conductivity type. Third body region 13c is formed to surround third source region 14c when viewed in a plan view, and has the second conductivity type. Second drift region 17b is sandwiched between second body region 13b and third body region 13c, and is separated from third source region 14c by third body region 13c. Third drift region 17c is sandwiched between first body region 13a and third body region 13c, and is separated from first source region 14a by first body region 13a. First connection region 22a is provided to be surrounded by first body region 13a, second body region 13b, third body region 13c, first drift region 17a, second drift region 17b, and third drift region 17c when viewed in a plan view. Thereby, the reverse transfer capacitance of silicon carbide semiconductor device 1 can be reduced more effectively.

(5) Preferably, in silicon carbide semiconductor device 1 in accordance with any of (1) to (4) described above, first body region 13a further has a fifth straight-line portion L5 which is located adjacent to first straight-line portion L1, on a side opposite to second straight-line portion L2, and constitutes an outer periphery of first body region 13a, when viewed in a plan view. Second body region 13b further has a sixth straight-line portion L6 which is located adjacent to third straight-line portion L3, on a side opposite to fourth straight-line portion L4, and constitutes an outer periphery of second body region 13b, when viewed in a plan view. Silicon carbide substrate 10 includes a second connection region 22b provided to include a third intersection 13a2 and a fourth intersection 13b2, third intersection 13a2 being an intersection of the straight line along first straight-line portion L1 and a straight line along fifth straight-line portion L5, fourth intersection 13b2 being an intersection of the straight line along third straight-line portion L3 and a straight line along sixth straight-line portion L6, second connection region 22b having the second conductivity type. A relation B>0.5×A is satisfied, where A represents a distance from the center of first connection region 22a to the center of second connection region 22b, and B represents a minimum distance between first connection region 22a and second connection region 22b, when viewed in a plan view. Thereby, the reverse transfer capacitance of silicon carbide semiconductor device 1 can be reduced effectively while securing its current density.

(6) Preferably, in silicon carbide semiconductor device 1 in accordance with any of (1) to (5) described above, first connection region 22a has an impurity concentration of more than or equal to $1\times10^{16}$ cm$^{-3}$ and less than or equal to $1\times10^{20}$ cm$^{-3}$. Thereby, first connection region 22a has an impurity density higher than that of first drift region 17a, and thus the electrostatic capacitance between gate electrode 27 in first connection region 22a and first drift region 17a can be suppressed.

(7) Preferably, in silicon carbide semiconductor device 1 in accordance with (6) described above, first connection region 22a has an impurity concentration of less than or equal to $1\times10^{19}$ cm$^{-3}$. When first connection region 22a has an impurity concentration of more than $1\times10^{19}$ cm$^{-3}$, crystallinity of first connection region 22a is disrupted, and thus the surface of first connection region 22a is roughened. In addition, when first connection region 22a has an impurity concentration of more than $1\times10^{19}$ cm$^{-3}$, a gate oxide film 15 grows on first connection region 22a at a slower speed, and thus the thickness of gate oxide film 15 on first connection region 22a is reduced. Accordingly, a leak current tends to be generated between gate electrode 27 and first connection region 22a. By setting the impurity concentration of first connection region 22a to less than or equal to $1\times10^{19}$ cm$^{-3}$, roughening of the surface of first connection region 22a can be suppressed, and the thickness of gate oxide film 15 on first connection region 22a can be increased. As a result, generation of a leak current between gate electrode 27 and first connection region 22a can be suppressed effectively.

(8) Preferably, in silicon carbide semiconductor device 1 in accordance with any of (1) to (7) described above, a thickness of first connection region 22a along a direction of a normal to first main surface 10a is less than or equal to a thickness of each of first body region 13a and second body region 13b. This can suppress an electric field from concentrating on a bottom portion of first connection region 22a.

(9) Preferably, silicon carbide semiconductor device 1 in accordance with any of (1) to (8) described above further includes a first contact region 18a which is surrounded by first source region 14a when viewed in a plan view and has the second conductivity type, and a second contact region 18b which is surrounded by second source region 14b when viewed in a plan view and has the second conductivity type. First connection region 22a has an impurity concentration identical to that of each of first contact region 18a and second contact region 18b. Thereby, first connection region 22a can be formed simultaneously with first contact region 18a and second contact region 18b.

(10) Preferably, in silicon carbide semiconductor device 1 in accordance with any of (1) to (8) described above, first connection region 22a has an impurity concentration identical to that of each of first body region 13a and second body region 13b. Thereby, first connection region 22a can be formed simultaneously with first body region 13a and second body region 13b.

(11) Preferably, silicon carbide semiconductor device 1 in accordance with any of (1) to (10) described above further includes gate oxide film 15 provided to be sandwiched between gate electrode 27 and each of first connection region 22a, first body region 13a, and second body region 13b. A thickness T1 of gate oxide film 15 on first connection region 22a is larger than a thickness of gate oxide film 15 on each of first body region 13a and second body region 13b. Thereby, generation of a leak current between gate electrode 27 and first connection region 22a can be suppressed effectively, even when the crystallinity of first connection region 22a is disrupted and thus the surface of first connection region 22a is roughened.

(12) Preferably, in silicon carbide semiconductor device 1 in accordance with any of (1) to (11) described above, the first conductivity type is n type, and the second conductivity type is p type. This facilitates the manufacturing process of silicon carbide semiconductor device 1.

(13) A method for manufacturing silicon carbide semiconductor device 1 in accordance with the embodiment includes steps of preparing silicon carbide substrate 10 having first main surface 10a and second main surface 10b opposite to first main surface 10a, and forming gate electrode 27 on a side of first main surface 10a of silicon carbide substrate 10. Silicon carbide substrate 10 includes first source region 14a and second source region 14b, first body region 13a, second body region 13b, first drift region 17a, second drift region 17b, third drift region 17c, and first connection region 22a First source region 14a and second source region 14b are adjacent to each other and have an outer shape that is a polygon when viewed in a plan view, and have the first conductivity type. First body region 13a is formed to surround first source region 14a when viewed in a plan view, and has the second conductivity type. Second body region 13b is formed to surround second source region 14b when viewed in a plan view, and has the second conductivity type. First drift region 17a is sandwiched between first body region 13a and second body region 13b, is separated from first source region 14a by first body region 13a, is separated from second source region 14b by second body region 13b, and has the first conductivity type. Second drift region 17b is in contact with second body region 13b, is separated from second source region 14b by second body region 13b, and has the first conductivity type. Third drift region 17c is in contact with first body region 13a, is separated from first source region 14a by first body region 13a, and has the first conductivity type. First body region 13a has first straight-line portion L1 which is in contact with first drift region 17a, and second straight-line portion L2 which is located adjacent to first straight-line portion L1 and is in contact with third drift region 17c when viewed in a plan view. Second body region 13b has third straight-line portion L3 which is in contact with first drift region 17a, and fourth straight-line portion L4 which is located adjacent to third straight-line portion L3, on a side close to second straight-line portion L2, and is in contact with second drift region 17b when viewed in a plan view. First connection region 22a is provided to include first intersection 13a1 and second intersection 13b1, first intersection 13a1 being an intersection of a straight line along first straight-line portion L1 and a straight line along second straight-line portion L2, second intersection 13b1 being an intersection of a straight line along third straight-line portion L3 and a straight line along fourth straight-line portion L4, and first connection region 22a has the second conductivity type. In the step of forming gate electrode 27, gate electrode 27 is formed to overlap first body region 13a sandwiched between first source region 14a and first drift region 17a, second body region 13b sandwiched between second source region 14b and first drift region 17a, and first connection region 22a, when viewed in a plan view. Thereby, the switching characteristics of silicon carbide semiconductor device 1 can be improved.

(14) Preferably, in the method for manufacturing silicon carbide semiconductor device 1 in accordance with (13) described above, the step of preparing silicon carbide substrate 10 includes a step of simultaneously forming first connection region 22a, first body region 13a, and second body region 13b. This simplifies the manufacturing process of silicon carbide semiconductor device 1.

(15) Preferably, in the method for manufacturing silicon carbide semiconductor device 1 in accordance with (14) described above, the step of preparing silicon carbide substrate 10 includes a step of forming a first mask layer 31 on first main surface 10a of silicon carbide substrate 10. First connection region 22a, first body region 13a, and second body region 13b are formed using first mask layer 31. First mask layer 31 is removed. A second mask layer 32 is formed on first main surface 10a of silicon carbide substrate 10. First source region 14a and second source region 14b are formed using second mask layer 32. Thereby, silicon carbide semiconductor device 1 can be manufactured efficiently.

(16) Preferably, in the method for manufacturing silicon carbide semiconductor device 1 in accordance with (13) described above, silicon carbide substrate 10 further includes first contact region 18a which is surrounded by first source region 14a when viewed in a plan view and has the second conductivity type, and second contact region 18b which is surrounded by second source region 14b when viewed in a plan view and has the second conductivity type. The step of preparing silicon carbide substrate 10 includes a step of simultaneously forming first connection region 22a, first contact region 18a, and second contact region 18b. This simplifies the manufacturing process of silicon carbide semiconductor device 1.

(17) Preferably, in the method for manufacturing silicon carbide semiconductor device 1 in accordance with (16) described above, the step of preparing silicon carbide substrate 10 further includes steps of forming first mask layer 31 on first main surface 10a of silicon carbide substrate 10, forming second mask layer 32 which is in contact with first mask layer 31 on silicon carbide substrate 10, and forming first source region 14a and second source region 14b using first mask layer 31 and second mask layer 32. The step of simultaneously forming first connection region 22a, first contact region 18a, and second contact region 18b is performed after the step of forming first source region 14a and second source region 14b. Thereby, first source region 14a and second source region 14b are formed using a self-alignment step, and thus first source region 14a and second source region 14b have an improved alignment accuracy.

(18) Preferably, the method for manufacturing silicon carbide semiconductor device 1 in accordance with any of (13) to (17) described above further includes a step of forming gate oxide film 15 which is in contact with each of first connection region 22a, first body region 13a, and second body region 13b. The step of forming gate oxide film 15 includes steps of forming a silicon dioxide layer 30 or a polysilicon layer 30 on first connection region 22a of silicon carbide substrate 10, and performing thermal oxidation on first main surface 10a of silicon carbide substrate 10 having silicon dioxide layer 30 or polysilicon layer 30 formed thereon. Thereby, the thickness of gate oxide film 15 on first connection region 22a can be larger than the thickness of gate oxide film 15 on each of first body region 13a and second body region 13b. As a result, generation of a leak current between gate electrode 27 and first connection region 22a can be suppressed effectively, even when the crystallinity of first connection region 22a is disrupted and thus the surface of first connection region 22a is roughened.

[Details of Embodiments of the Invention of the Present Application]

(First Embodiment)

Figure 2:
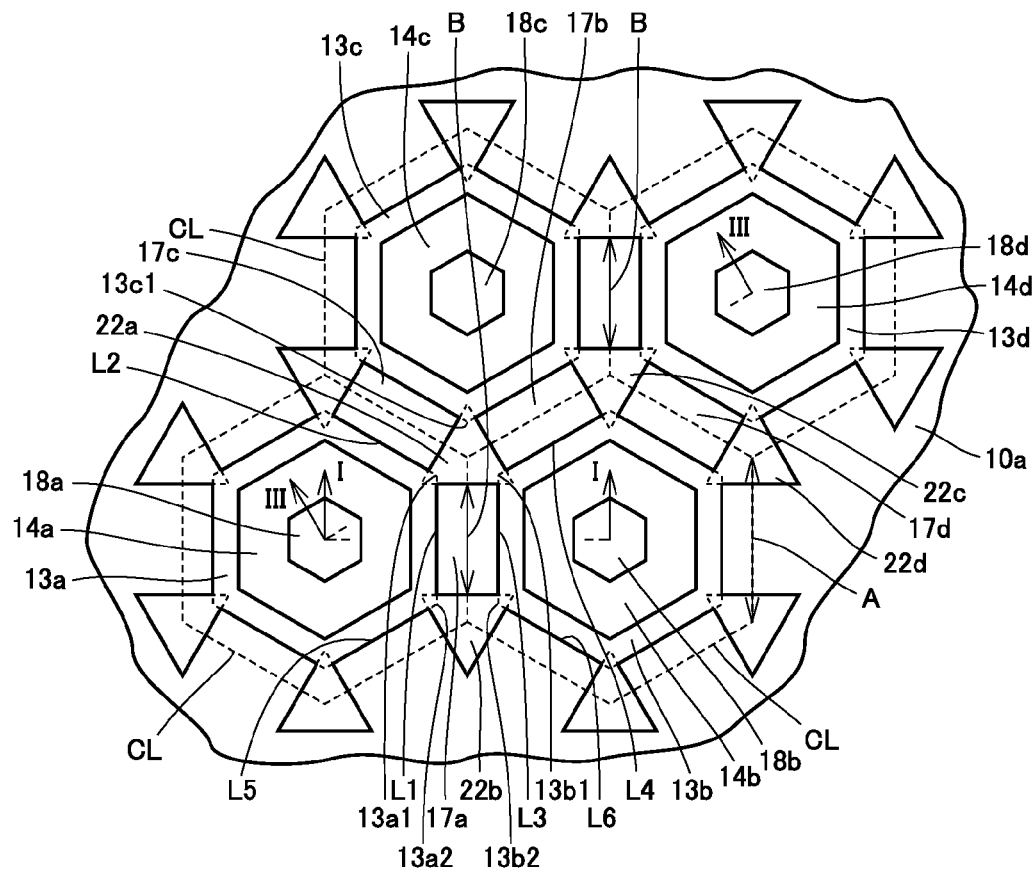
FIG. 2 is a schematic plan view schematically showing a structure of a first main surface of a silicon carbide substrate of the silicon carbide semiconductor device in accordance with the first embodiment of the present invention.
Figure 3:
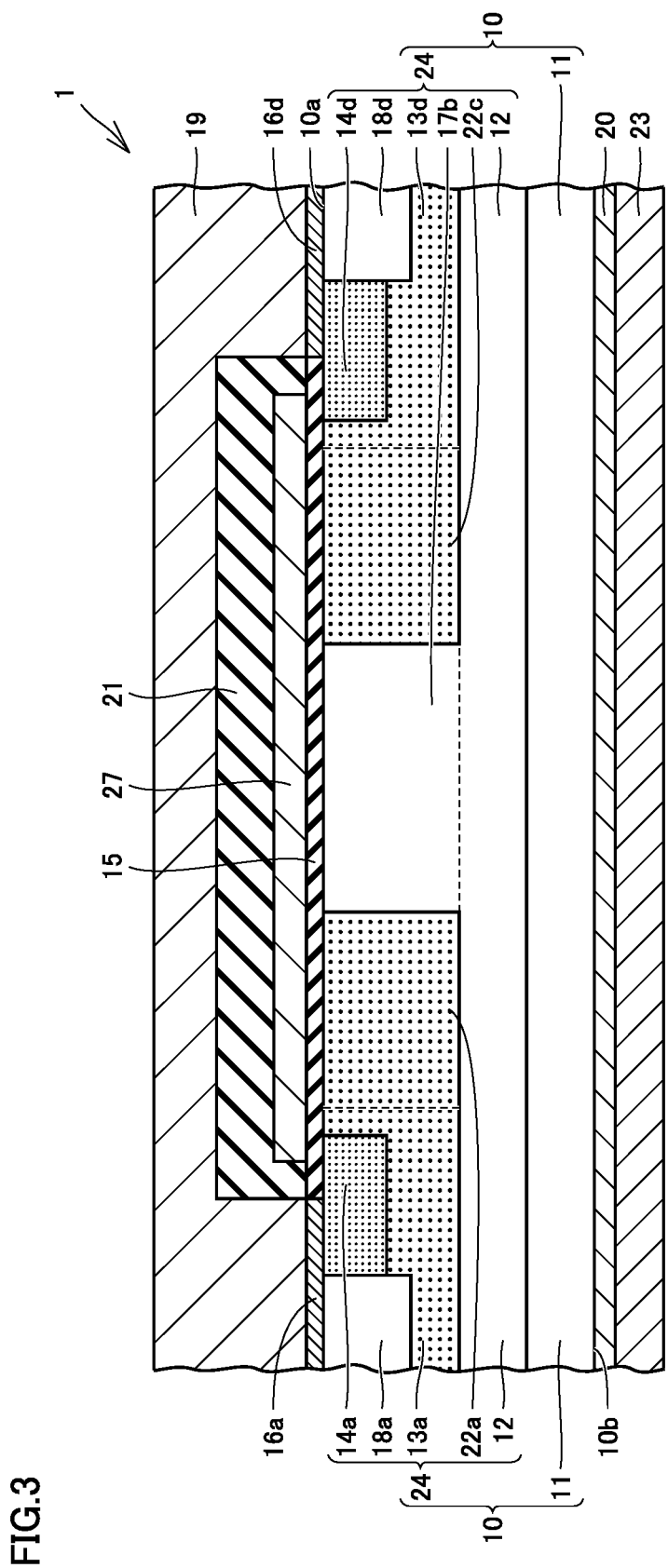
FIG. 3 is a schematic cross sectional view in a region in FIG. 2.

Referring to FIGS. 1, 2, and 3, a configuration of silicon carbide semiconductor device 1 in accordance with a first embodiment will be described. FIG. 1 is a schematic cross sectional view in a region I-I in FIG. 2, and FIG. 3 is a schematic cross sectional view in a region in FIG. 2. A MOSFET 1 as an example of silicon carbide semiconductor device 1 mainly has silicon carbide substrate 10, gate insulating film 15 (gate oxide film 15), gate electrode 27, a source contact electrode, and a drain electrode 20.

Silicon carbide substrate 10 is made of, for example, hexagonal silicon carbide having a polytype of 4H. The main surface of silicon carbide substrate 10 may be, for example, a plane having an off angle of less than or equal to about 8° with respect to a (0001) plane, and may be a (0-33-8) plane. Silicon carbide substrate 10 mainly has a base substrate 11, and a silicon carbide epitaxial layer 24 arranged on base substrate 11. Base substrate 11 is made of, for example, a hexagonal silicon carbide single crystal having a polytype of 4H, and has n type conductivity type (the first conductivity type). Silicon carbide epitaxial layer 24 mainly has a drift region, a body region, a contact region, and a connection region.

The drift region mainly includes first drift region 17a, second drift region 17b, third drift region 17c, a fourth drift region 17d, and a drift layer 12. Drift layer 12 is arranged on base substrate 11. Each of first drift region 17a, second drift region 17b, third drift region 17c, fourth drift region 17d, and drift layer 12 contains an impurity such as nitrogen, for example, and has n type conductivity type. The impurity such as nitrogen contained in each of first drift region 17a, second drift region 17b, third drift region 17c, fourth drift region 17d, and drift layer 12 has a concentration of about $5 \times 10^{15}$ cm$^{-3}$, for example.

The body region mainly includes first body region 13a, second body region 13b, third body region 13c, and a fourth body region 13d. For example, each of first body region 13a, second body region 13b, third body region 13c, and fourth body region 13d contains an impurity such as aluminum (Al) or boron (B), for example, and has p type conductivity type (the second conductivity type). The impurity such as aluminum or boron contained in each of first body region 13a, second body region 13b, third body region 13c, and fourth body region 13d has a concentration of about $1 \times 10^{17}$ cm$^{-3}$, for example.

The source region mainly includes first source region 14a, second source region 14b, third source region 14c, and a fourth source region 14d. Each of first source region 14a, second source region 14b, third source region 14c, and fourth source region 14d contains an impurity such as phosphorus (P), for example, and has n type conductivity type. The concentration of the impurity in each of first source region 14a, second source region 14b, third source region 14c, and fourth source region 14d is higher than the concentration of the impurity in each of first drift region 17a, second drift region 17b, third drift region 17c, fourth drift region 17d, and drift layer 12. The impurity such as phosphorus contained in each of first source region 14a, second source region 14b, third source region 14c, and fourth source region 14d has a concentration of about $1 \times 10^{20}$ cm$^{-3}$, for example.

The contact region mainly includes first contact region 18a, second contact region 18b, a third contact region 18c, and a fourth contact region 18d. Each of first contact region 18a, second contact region 18b, third contact region 18c, and fourth contact region 18d contains an impurity such as Al, for example, and has p type conductivity type. The concentration of the impurity in each of first contact region 18a, second contact region 18b, third contact region 18c, and fourth contact region 18d is higher than the concentration of the impurity in each of first body region 13a, second body region 13b, third body region 13c, and fourth body region 13d. The impurity such as Al contained in each of first contact region 18a, second contact region 18b, third contact region 18c, and fourth contact region 18d has a concentration of about $1 \times 10^{20}$ cm$^{-3}$, for example.

Referring to FIG. 1, when viewed in a cross sectional view (field of view in a direction parallel to first main surface 10a), first drift region 17a is provided on drift layer 12, and is sandwiched between first body region 13a and second body region 13b. First drift region 17a is separated from first source region 14a by first body region 13a, and is separated from second source region 14b by second body region 13b. Referring to FIG. 2, second drift region 17b is provided on drift layer 12, is in contact with second body region 13b, and is sandwiched between second body region 13b and third body region 13c. Second drift region 17b is separated from second source region 14b by second body region 13b, and is separated from third source region 14c by third body region 13c. Similarly, third drift region 17c is provided on drift layer 12, is in contact with first body region 13a, and is sandwiched between third body region 13c and first body region 13a. Third drift region 17c is separated from third source region 14c by third body region 13c, and is separated from first source region 14a by first body region 13a. Each of first body region 13a, second body region 13b, and third body region 13c is provided on drift layer 12.

Referring to FIG. 2, when viewed in a plan view (field of view in the direction of the normal to first main surface 10a), each of first source region 14a, second source region 14b, and third source region 14c has an outer shape that is a polygon. The polygon is, for example, a hexagon, and is preferably a regular hexagon. The polygon may be a quadrangle such as a rectangle or a square. When viewed in a plan view, first source region 14a and second source region 14b are adjacent to each other, second source region 14b and third source region 14c are adjacent to each other, and third source region 14c and first source region 14a are adjacent to each other.

When viewed in a plan view, first body region 13a is formed to surround first source region 14a, second body region 13b is formed to surround second source region 14b, and third body region 13c is formed to surround third source region 14c.

When viewed in a plan view, each of first contact region 18a, second contact region 18b, and third contact region 18c may have a shape similar to that of each of first source region 14a, second source region 14b, and third source region 14c. First contact region 18a is formed to be surrounded by first source region 14a, second contact region 18b is formed to be surrounded by second source region 14b, and third contact region 18c is formed to be surrounded by third source region 14c.

The connection region mainly includes first connection region 22a, second connection region 22b, a third connection region 22c, and a fourth connection region 22d. Each of first connection region 22a, second connection region 22b, third connection region 22c, and fourth connection region 22d contains an impurity such as aluminum (Al) or boron (B), for example, and has p type conductivity type. The impurity such as aluminum or boron contained in each of first connection region 22a, second connection region 22b, third connection region 22c, and fourth connection region 22d has a concentration of more than or equal to about $1 \times 10^{16}$ cm$^{-3}$ and less than or equal to about $1 \times 10^{20}$ cm$^{-3}$, for example. The concentration of the impurity in each of first connection region 22a, second connection region 22b, third connection region 22c, and fourth connection region 22d is preferably more than or equal to about $1 \times 10^{16}$ cm$^{-3}$ and less than or equal to about $1 \times 10^{19}$ cm$^{-3}$, more preferably more than or equal to about $1 \times 10^{16}$ cm$^{-3}$ and less than or equal to about $1 \times 10^{18}$ cm$^{-3}$, and further preferably more than or equal to about $1 \times 10^{17}$ cm$^{-3}$ and less than or equal to about $1 \times 10^{18}$ cm$^{-3}$. Each of first connection region 22a, second connection region 22b, third connection region 22c, and fourth connection region 22d may contain the same impurity as that in each of first body region 13a, second body region 13b, third body region 13c, and fourth body region 13d, and may have an impurity concentration similar thereto. Further, each of first connection region 22a, second connection region 22b, and third connection region 22c may contain the same impurity as that in each of first contact region 18a, second contact region 18b, and third contact region 18c, and may have an impurity concentration similar thereto.

When viewed in a plan view, each of first body region 13a, second body region 13b, and third body region 13c has an outer shape that is substantially a hexagon. First connection region 22a is formed to connect first body region 13a, second body region 13b, and third body region 13c.

Referring to FIG. 2, first body region 13a has first straight-line portion L1 which is in contact with first drift region 17a, second straight-line portion L2 which is located adjacent to first straight-line portion L1 and is in contact with third drift region 17c when viewed in a plan view, and fifth straight-line portion L5 which is located adjacent to first straight-line portion L1, on a side opposite to second straight-line portion L2, when viewed in a plan view. First straight-line portion L1, second straight-line portion L2, and fifth straight-line portion L5 constitute an outer periphery of first drift region 17a. Second body region 13b has third straight-line portion L3 which is in contact with first drift region 17a, fourth straight-line portion L4 which is located adjacent to third straight-line portion L3, on a side close to second straight-line portion L2, and is in contact with second drift region 17b when viewed in a plan view, and sixth straight-line portion L6 which is located adjacent to third straight-line portion L3, on a side opposite to fourth straight-line portion L4, when viewed in a plan view. Third straight-line portion L3, fourth straight-line portion L4, and sixth straight-line portion L6 constitute an outer periphery of second drift region 17b.

First connection region 22a is provided to include first intersection 13a1 and second intersection 13b1, first intersection 13a1 being an intersection of a straight line along first straight-line portion L1 and a straight line along second straight-line portion L2, second intersection 13b1 being an intersection of a straight line along third straight-line portion L3 and a straight line along fourth straight-line portion L4. First connection region 22a is provided to be surrounded by first body region 13a, second body region 13b, third body region 13c, first drift region 17a, second drift region 17b, and third drift region 17c when viewed in a plan view.

Second connection region 22b is provided to include third intersection 13a2 and fourth intersection 13b2, third intersection 13a2 being an intersection of the straight line along first straight-line portion L1 and a straight line along fifth straight-line portion L5, fourth intersection 13b2 being an intersection of the straight line along third straight-line portion L3 and a straight line along sixth straight-line portion L6.

When viewed in a plan view, each of first connection region 22a, second connection region 22b, and third connection region 22c has an outer shape that is a triangle, and preferably has an outer shape that is a regular triangle. It should be noted that the case where each of first connection region 22a, second connection region 22b, and third connection region 22c has an outer shape that is a triangle includes a case where the outer shape of each of first connection region 22a, second connection region 22b, and third connection region 22c is formed to follow three sides of a triangle. The outer shape of the connection region may be a polygon other than a triangle, such as a quadrangle or a hexagon, for example.

As shown in FIG. 2, the relation $B > 0.5 \times A$ is satisfied, where A represents the distance from the center of first connection region 22a to the center of second connection region 22b, and B represents the minimum distance between first connection region 22a and second connection region 22b, when viewed in a plan view. It should be noted that the center of first connection region 22a corresponds to the position of the center of gravity of first connection region 22a having a two-dimensional shape when first connection region 22a is viewed in a plan view. The same applies to the center of second connection region 22b. Distance A is 6.3 µm, for example, and distance B is 3.5 µm, for example. It should be noted that distance A corresponds to the length of one side of a cell CL described later.

Referring to FIGS. 1 and 3, gate insulating film 15 is made of, for example, silicon dioxide, and is arranged in contact with first main surface 10a of silicon carbide substrate 10. Gate insulating film 15 is in contact with the body region, the source region, and the drift region in first main surface 10a. Specifically, gate insulating film 15 is provided in contact with first source region 14a, first body region 13a, first drift region 17a, second body region 13b, and second source region 14b. A channel region CH is constituted such that it can be formed in a region of first body region 13a which is sandwiched between first drift region 17a and first source region 14a and which faces gate insulating film 15. Similarly, a channel region CH is constituted such that it can be formed in a region of second body region 13b which is sandwiched between first drift region 17a and second source region 14b and which faces gate insulating film 15.

The source contact electrode mainly includes a first source contact electrode 16a and a second source contact electrode 16b. As shown in FIG. 1, first source contact electrode 16a is arranged in contact with first source region 14a, first contact region 18a, and gate insulating film 15. Further, second source contact electrode 16b is arranged in contact with second source region 14b, second contact region 18b, and gate insulating film 15. Each of first source contact electrode 16a and second source contact electrode 16b is made of a material which can be in ohmic contact with each of first source region 14a and second source region 14b, such as NiSi or TiAlSi, for example.

Drain electrode 20 is formed in contact with second main surface 10b on a side of silicon carbide substrate 10 opposite to a side on which drift layer 12 is formed. Drain electrode 20 is made of a material which can be in ohmic contact with n type base substrate 11, such as NiSi, for example, and is electrically connected with base substrate 11. A pad electrode 23 is arranged in contact with drain electrode 20. A source wire 19 and drain electrode 20 are constituted such that a current flowing between source wire 19 and drain electrode 20 can be controlled by a gate voltage applied to gate electrode 27.

An interlayer insulating film 21 is formed to surround gate electrode 27. Interlayer insulating film 21 is made of, for example, silicon dioxide which is an insulator. Source wire 19 surrounds interlayer insulating film 21 on first main surface 10a of silicon carbide substrate 10. Source wire 19 is in contact with each of first source contact electrode 16a and second source contact electrode 16b. The source wire is made of a conductor such as Al, for example, is electrically connected with first source region 14a via first source contact electrode 16a, and is electrically connected with second source region 14b via second source contact electrode 16b.

Gate electrode 27 is arranged to face channel region CH in first body region 13a sandwiched between first source region 14a and first drift region 17a and to face channel region CH in second body region 13b sandwiched between second source region 14b and first drift region 17a, so as to extend from a position facing first source region 14a to a position facing second source region 14b. Gate electrode 27 is arranged in contact with gate insulating film 15 so as to sandwich gate insulating film 15 between silicon carbide substrate 10 and gate electrode 27. Further, gate electrode 27 is made of a conductor such as polysilicon doped with an impurity, or aluminum.

Figure 4:
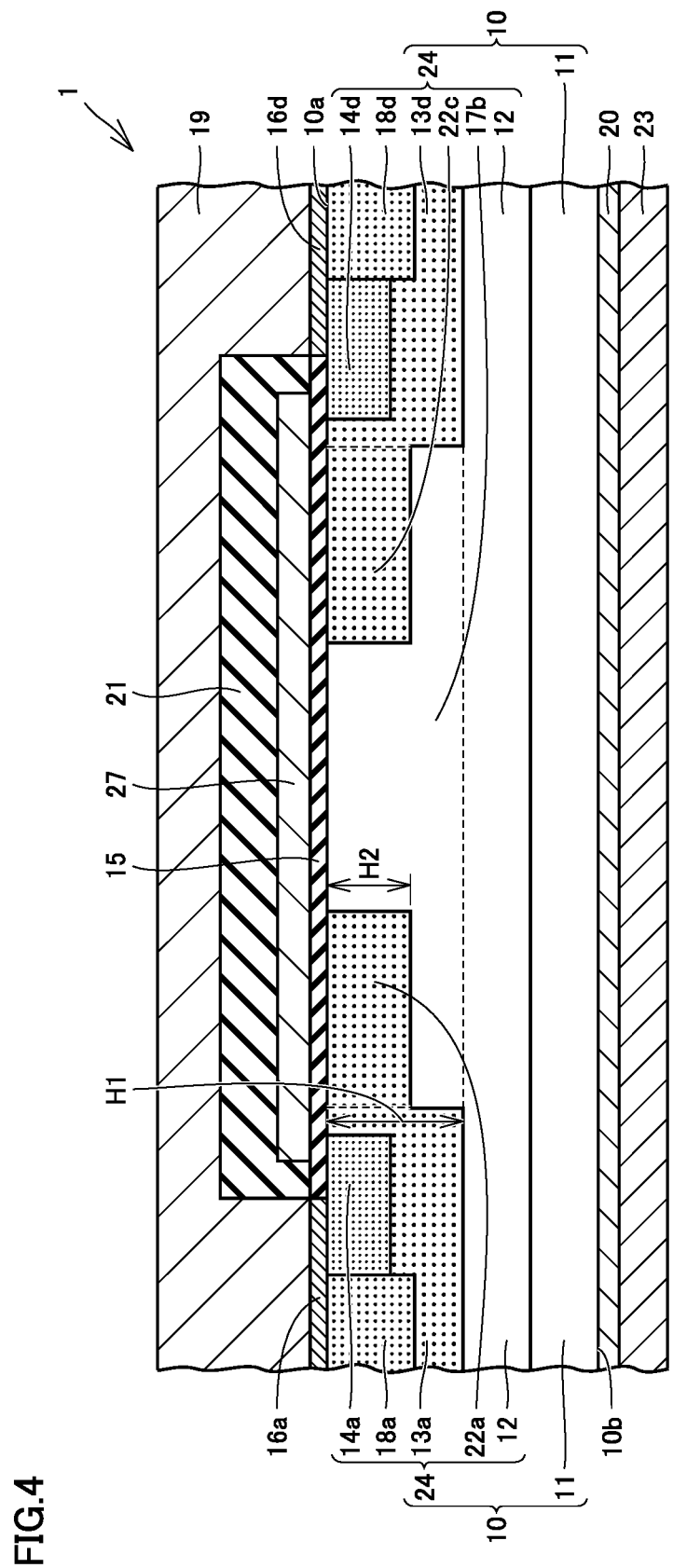
FIG. 4 is a schematic cross sectional view schematically showing a structure of a variation of the silicon carbide semiconductor device in accordance with the first embodiment of the present invention.

Referring to FIG. 3, a cross sectional structure in region in FIG. 2 will be described. As shown in FIG. 3, first connection region 22a is provided to be connected with first body region 13a. Similarly, third connection region 22c is provided to be connected with fourth body region 13d. Preferably, as shown in FIG. 4, a thickness H2 of first connection region 22a along the direction of the normal to first main surface 10a of silicon carbide substrate 10 is less than or equal to a thickness H1 of each of first body region 13a and second body region 13b. That is, thickness H2 of first connection region 22a along the direction of the normal to first main surface 10a may be almost the same as the thickness of first body region 13a along the direction of the normal to first main surface 10a. Further, thickness H2 of first connection region 22a along the direction of the normal to first main surface 10a may be almost the same as a thickness of first contact region 18a along the direction of the normal to first main surface 10a.

Referring to FIG. 2, each of first connection region 22a, second connection region 22b, and third connection region 22c may have the almost same impurity concentration as that of each of first contact region 18a, second contact region 18b, and third contact region 18c. Further, each of first connection region 22a, second connection region 22b, and third connection region 22c may have the almost same impurity concentration as that of each of first body region 13a, second body region 13b, and third body region 13c. Here, the almost same impurity concentration includes an impurity concentration with the same number of digits.

Figure 5:
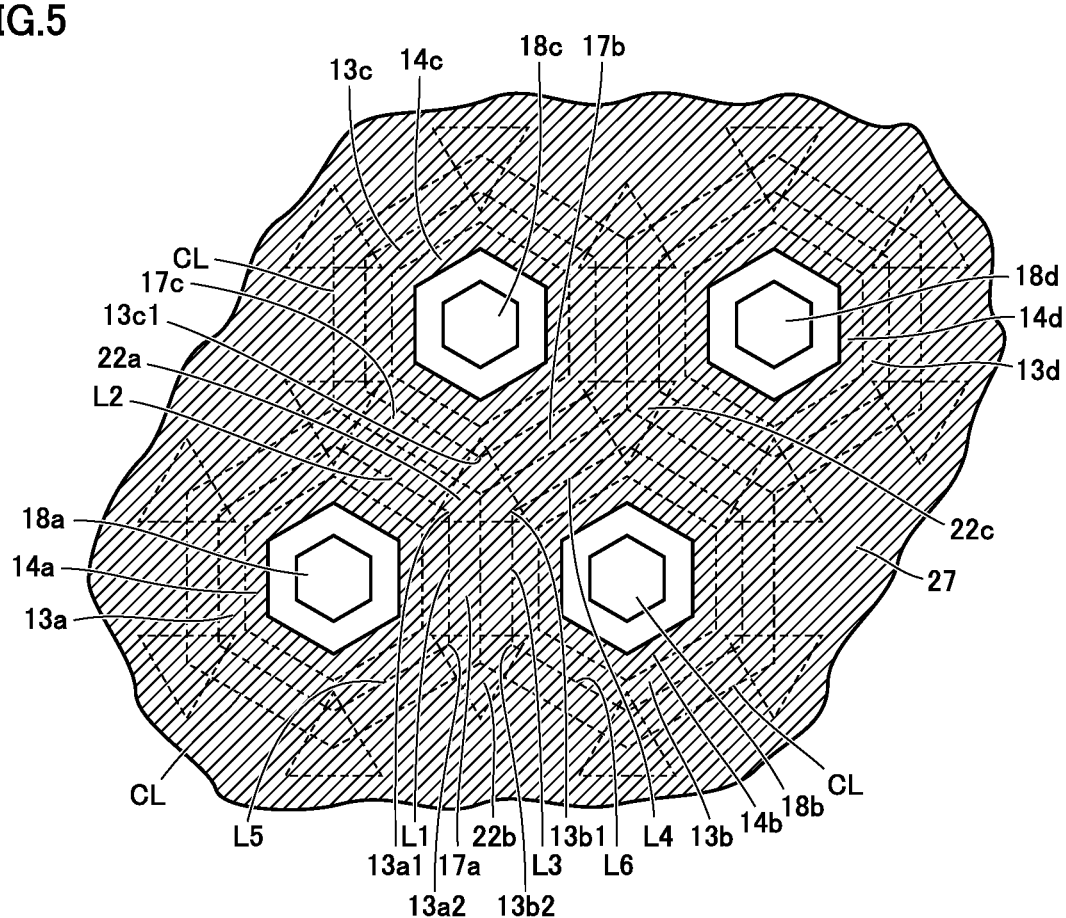
FIG. 5 is a schematic plan view schematically showing a structure of a gate electrode of the silicon carbide semiconductor device in accordance with the first embodiment of the present invention.

Referring to FIG. 5, gate electrode 27 is provided to overlap first body region 13a sandwiched between first source region 14a and first drift region 17a, second body region 13b sandwiched between second source region 14b and first drift region 17a, and first connection region 22a, when viewed in a plan view. Gate electrode 27 may be provided to overlap each of second connection region 22b and third connection region 22c, or to overlap each of first drift region 17a, second drift region 17b, and third drift region 17c, when viewed in a plan view.

Next, an operation of the MOSFET will be described. Referring to FIG. 1, in a state where the voltage at gate electrode 27 is less than a threshold voltage, i.e., in an OFF state, a pn junction between the body region and the drift region located immediately below gate insulating film 15 is reverse-biased. Accordingly, the MOSFET is in an nonconductive state. On the other hand, when a voltage which is more than or equal to the threshold voltage is applied to gate electrode 27, an inversion layer is formed in channel region CH which is a portion of the body region in contact with gate insulating film 15. As a result, the source region and the drift region are electrically connected with each other, whereby a current flows between source wire 19 and drain electrode 20.

Figure 6:
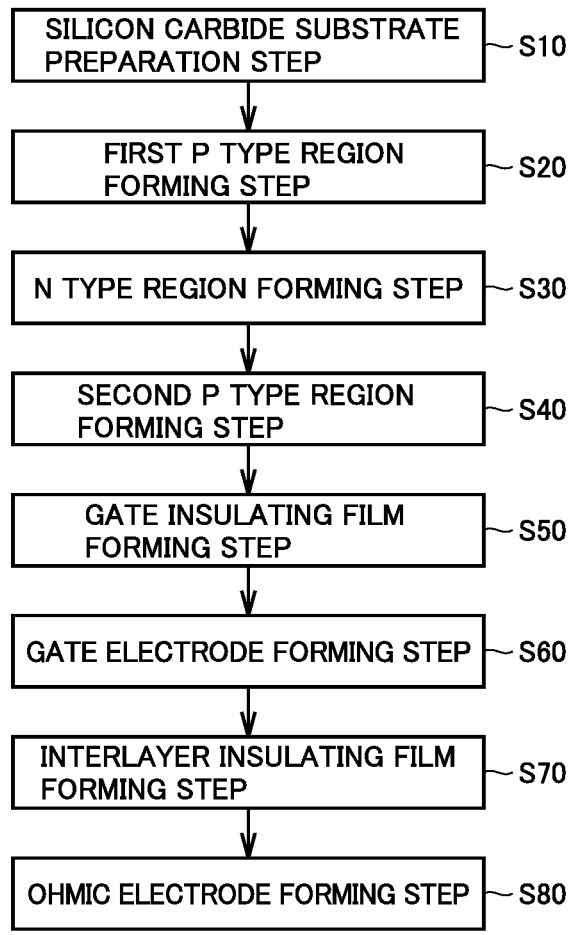
FIG. 6 is a flowchart schematically showing a method for manufacturing the silicon carbide semiconductor device in accordance with the first embodiment of the present invention.

Next, an example of a method for manufacturing MOSFET 1 in the present embodiment will be described with reference to FIG. 6.

Figure 7:
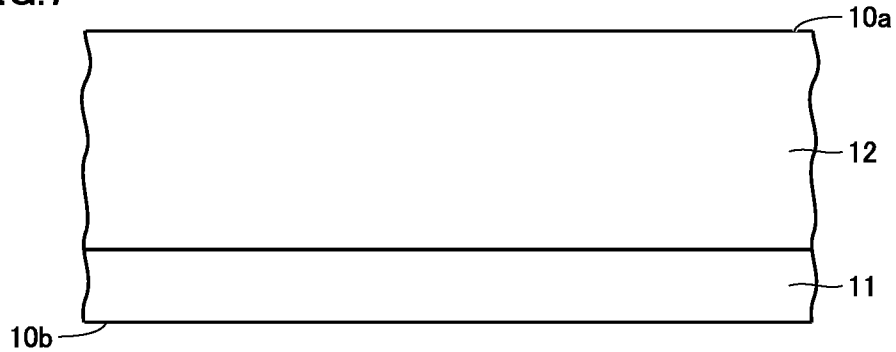
FIG. 7 is a schematic cross sectional view schematically showing a first step of the method for manufacturing the silicon carbide semiconductor device in accordance with the first embodiment of the present invention.

First, a silicon carbide substrate preparation step (S10: FIG. 6) is performed. Specifically, referring to FIG. 7, base substrate 11 made of, for example, hexagonal silicon carbide having a polytype of 4H is prepared, and n type (the first conductivity type) drift layer 12 is formed on base substrate 11 by epitaxial growth. Drift layer 12 contains an impurity such as N (nitrogen) ions, for example. As described above, silicon carbide substrate 10 having first main surface 10a and second main surface 10b opposite to first main surface 10a and having n type is prepared. First main surface 10a of silicon carbide substrate 10 may be a plane having an off angle of less than or equal to about 8° with respect to a (0001) plane, for example.

Figure 8:
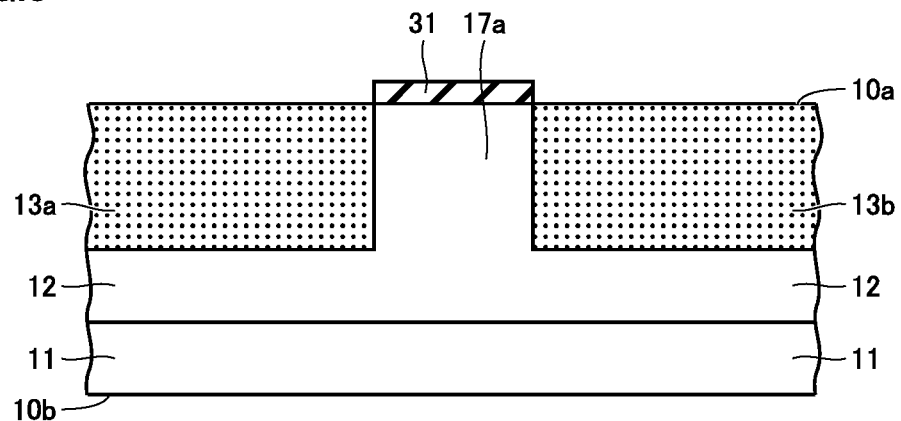
FIG. 8 is a schematic cross sectional view schematically showing a second step of the method for manufacturing the silicon carbide semiconductor device in accordance with the first embodiment of the present invention.

Next, a first p type region forming step (S20: FIG. 6) is performed. Specifically, referring to FIG. 8, first mask layer 31 having openings at desired regions where ion implantation should be performed is formed on first main surface 10a of drift layer 12. First mask layer 31 is made of, for example, silicon dioxide. Next, Al (aluminum) ions, for example, are implanted into drift layer 12 using first mask layer 31, to form first body region 13a, second body region 13b, third body region 13c, and fourth body region 13d.

Figure 9:
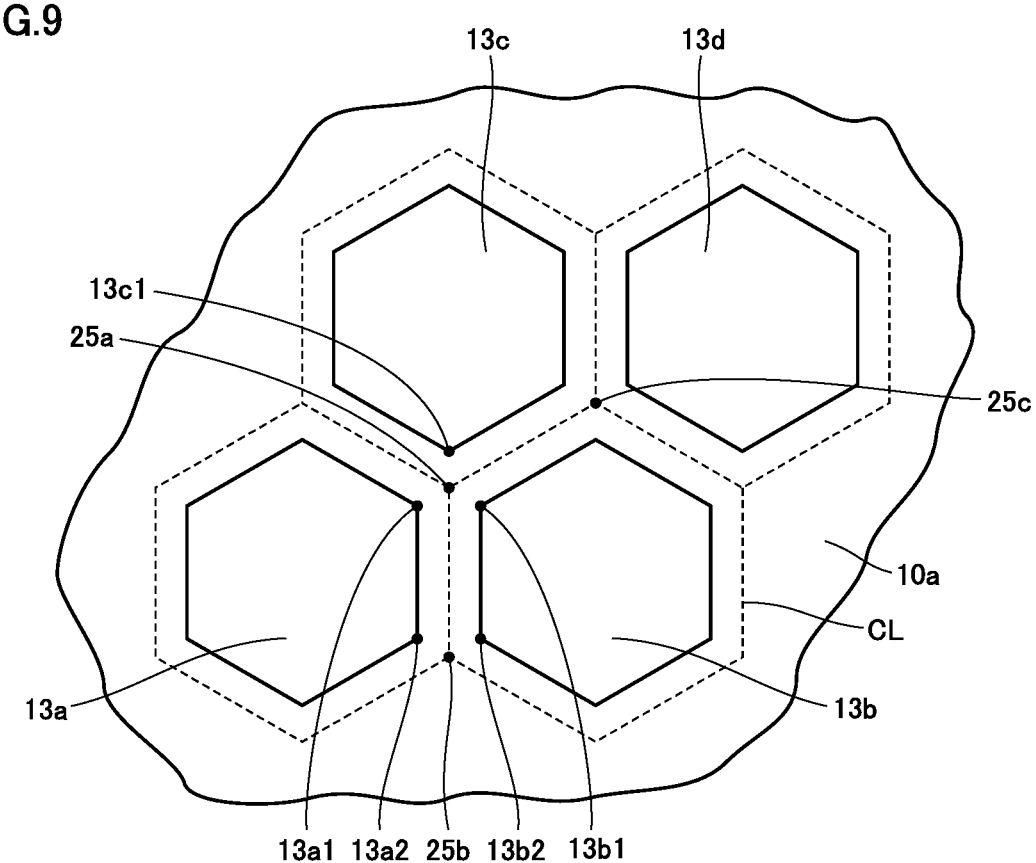
FIG. 9 is a schematic plan view schematically showing a third step of the method for manufacturing the silicon carbide semiconductor device in accordance with the first embodiment of the present invention.

As shown in FIG. 9, each of first body region 13a, second body region 13b, third body region 13c, and fourth body region 13d is a polygon, preferably a hexagon, and more preferably a regular hexagon, when viewed in a plan view. Any two body regions of first body region 13a, second body region 13b, and third body region 13c are arranged such that a side constituting a polygon in one body region faces a side constituting a polygon in the other body region. An intermediate position between the two facing sides is indicated by a broken line in FIG. 9. A region surrounded by the broken line is also a polygon, as with the body region. The region in the shape of a polygon surrounded by the broken line will be referred to as cell CL. Cell CL in the present embodiment is in the shape of a regular hexagon. Cells CL are arranged such that, when viewed in a plan view, respective sides of one cell CL are in contact with other cells CL. Specifically, six cells CL are arranged in contact with six sides of hexagonal cell CL. Positions where three cells CL are in contact with each other are referred to as triple points 25a, 25b, 25c.

It should be noted that first intersection 13a1 described above may be a first vertex of first body region 13a. Similarly, third intersection 13a2 described above may be a third vertex of first body region 13a. Similarly, second intersection 13b1 and fourth intersection 13b2 described above may be a second vertex and a fourth vertex, respectively, of second body region 13b.

Figure 10:
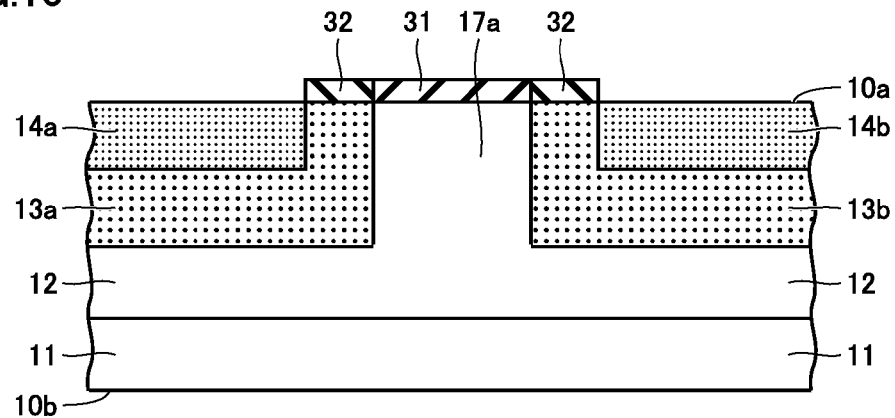
FIG. 10 is a schematic cross sectional view schematically showing a fourth step of the method for manufacturing the silicon carbide semiconductor device in accordance with the first embodiment of the present invention.
Figure 11:
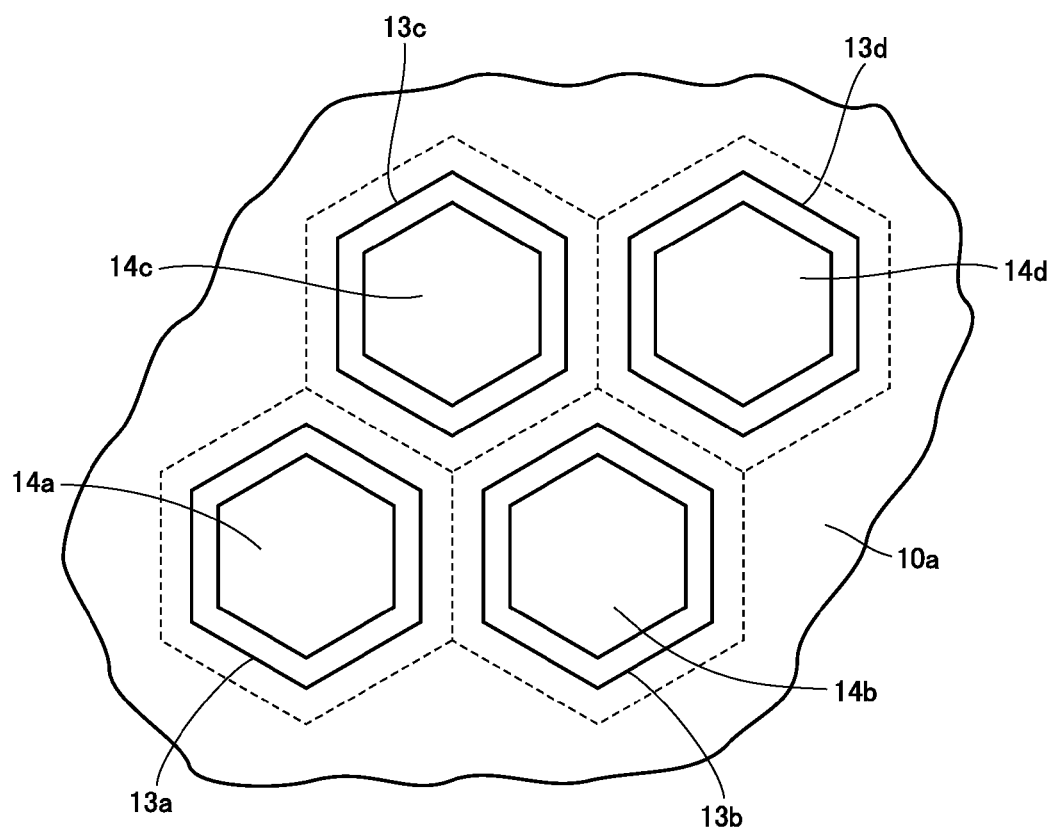
FIG. 11 is a schematic plan view schematically showing a fifth step of the method for manufacturing the silicon carbide semiconductor device in accordance with the first embodiment of the present invention.

Next, an n type region forming step (S30: FIG. 6) is performed. Specifically, referring to FIG. 10, second mask layer 32 which is in contact with first mask layer 31 and has openings at desired regions where ion implantation should be performed is formed, with first mask layer 31 remaining on first main surface 10a of silicon carbide substrate 10. Preferably, second mask layer 32 is formed inside each opening of first mask layer 31 and is in contact with the inner wall of first mask layer 31. Next, P (phosphorus) ions, for example, are implanted into first body region 13a and second body region 13b using first mask layer 31 and second mask layer 32, to form first source region 14a within first body region 13a and to form second source region 14b within second body region 13b. As shown in FIG. 11, the outer shape of each of first source region 14a and second source region 14b is similar to the outer shape of each of first body region 13a and second body region 13b. That is, the outer shape of each of first source region 14a and second source region 14b is a polygon, preferably a hexagon, and more preferably a regular hexagon. Next, first mask layer 31 and second mask layer 32 are removed for example by etching.

Figure 12:
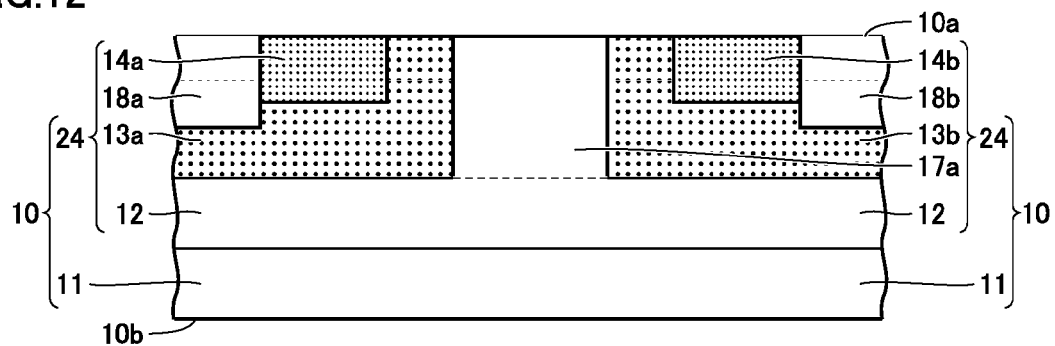
FIG. 12 is a schematic cross sectional view schematically showing a sixth step of the method for manufacturing the silicon carbide semiconductor device in accordance with the first embodiment of the present invention.

Next, a second p type region forming step (S40: FIG. 6) is performed. Specifically, a third mask layer (not shown) having openings in the contact region and the connection region is formed on first main surface 10a of silicon carbide substrate 10. Al ions, for example, are implanted into the source region using the third mask layer described above, to form the contact region within the source region. Preferably, the contact region and the connection region are simultaneously formed. Specifically, first contact region 18a, second contact region 18b, third contact region 18c, fourth contact region 18d, first connection region 22a, second connection region 22b, and third connection region 22c are simultaneously formed (see FIGS. 12 and 13).

Figure 13:
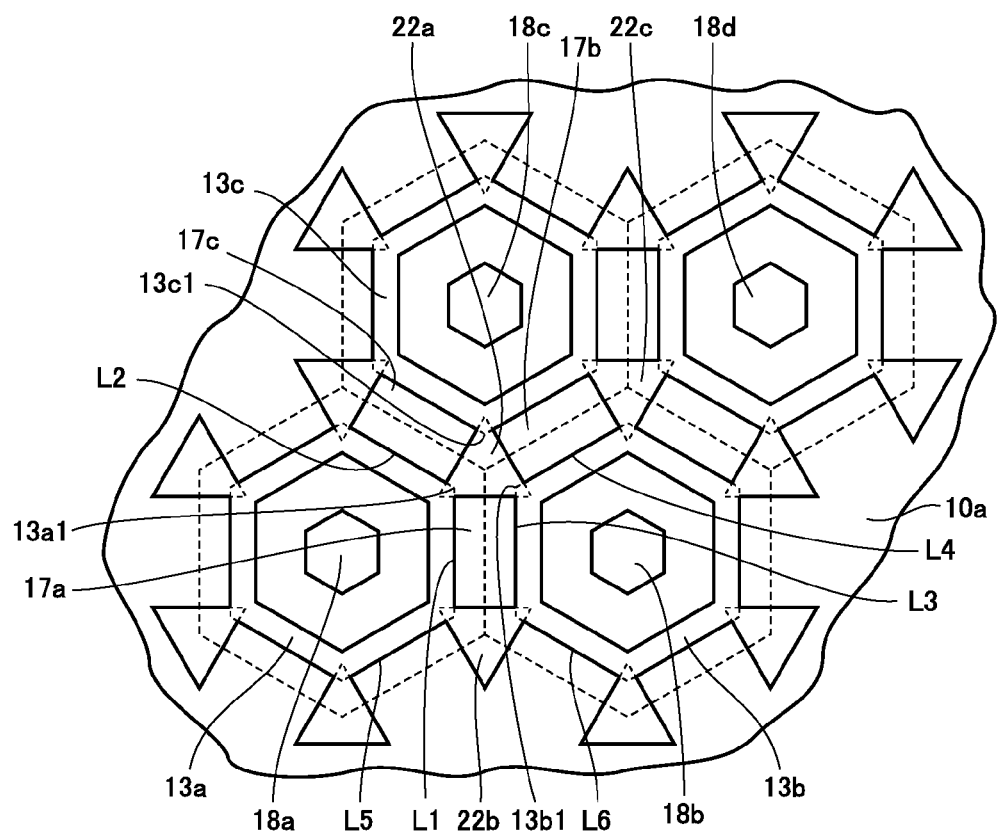
FIG. 13 is a schematic plan view schematically showing a seventh step of the method for manufacturing the silicon carbide semiconductor device in accordance with the first embodiment of the present invention.

Referring to FIG. 13, first body region 13a has first straight-line portion L1 which is in contact with first drift region 17a, second straight-line portion L2 which is located adjacent to first straight-line portion L1 and is in contact with third drift region 17c when viewed in a plan view, and fifth straight-line portion L5 which is located adjacent to first straight-line portion L1, on a side opposite to second straight-line portion L2, when viewed in a plan view. First straight-line portion L1, second straight-line portion L2, and fifth straight-line portion L5 constitute the outer periphery of first drift region 17a. Second body region 13b has third straight-line portion L3 which is in contact with first drift region 17a, fourth straight-line portion L4 which is located adjacent to third straight-line portion L3, on a side close to second straight-line portion L2, and is in contact with second drift region 17b when viewed in a plan view, and sixth straight-line portion L6 which is located adjacent to third straight-line portion L3, on a side opposite to fourth straight-line portion L4, when viewed in a plan view. Third straight-line portion L3, fourth straight-line portion L4, and sixth straight-line portion L6 constitute the outer periphery of second drift region 17b.

First connection region 22a is formed to include first intersection 13a1 and second intersection 13b1, first intersection 13a1 being an intersection of a straight line along first straight-line portion L1 and a straight line along second straight-line portion L2, second intersection 13b1 being an intersection of a straight line along third straight-line portion L3 and a straight line along fourth straight-line portion L4. First connection region 22a is formed to be surrounded by first body region 13a, second body region 13b, third body region 13c, first drift region 17a, second drift region 17b, and third drift region 17c when viewed in a plan view. Second connection region 22b is formed to include third intersection 13a2 and fourth intersection 13b2, third intersection 13a2 being an intersection of the straight line along first straight-line portion L1 and a straight line along fifth straight-line portion L5, fourth intersection 13b2 being an intersection of the straight line along third straight-line portion L3 and a straight line along sixth straight-line portion L6.

Preferably, each of first connection region 22a, second connection region 22b, and third connection region 22c is formed to overlap each of triple points 25a, 25b, 25c of three cells CL in FIG. 9, when viewed in a plan view. Since triple point 25a is a position farthest from each of first body region 13a, second body region 13b, and third body region 13c, when the drift region is depleted, it takes time until a depletion layer reaches triple point 25a. Accordingly, the reverse transfer capacitance tends to be increased in the vicinity of triple point 25a. The reverse transfer capacitance of MOSFET 1 can be reduced effectively by arranging first connection region 22a to overlap triple point 25a of three cells CL when viewed in a plan view.

As described above, silicon carbide substrate 10 which includes the drift region having n type, the body region in contact with the drift region and having p type, the source region separated from the drift region by the body region and having n type, and the contact region in contact with the body region and the source region is prepared. Silicon carbide substrate 10 includes first source region 14a and second source region 14b, first body region 13a, second body region 13b, first drift region 17a, second drift region 17b, third drift region 17c, and first connection region 22a. First source region 14a and second source region 14b are adjacent to each other and have an outer shape that is a polygon when viewed in a plan view, and have the first conductivity type. First body region 13a is formed to surround first source region 14a when viewed in a plan view, and has the second conductivity type. Second body region 13b is formed to surround second source region 14b when viewed in a plan view, and has the second conductivity type. First drift region 17a is sandwiched between first body region 13a and second body region 13b, is separated from first source region 14a by first body region 13a, is separated from second source region 14b by second body region 13b, and has the first conductivity type. Second drift region 17b is in contact with second body region 13b, is separated from second source region 14b by second body region 13b, and has the first conductivity type. Third drift region 17c is in contact with first body region 13a, is separated from first source region 14a by first body region 13a, and has the first conductivity type.

Next, an activation annealing step is performed. Specifically, heat treatment of heating silicon carbide substrate 10 described above to about 1700° C., for example, in an atmosphere of an inert gas such as argon, for example, and holding it for about 30 minutes is performed. Thereby, the implanted impurities are activated.

Figure 14:
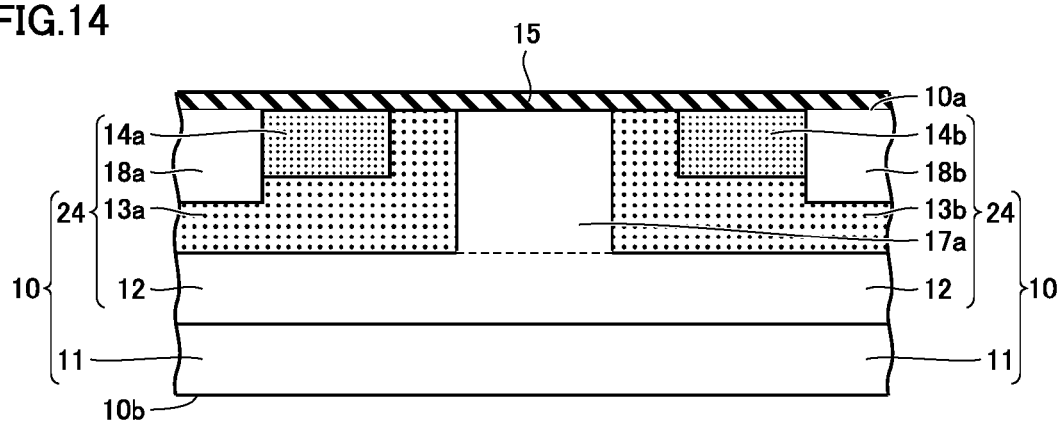
FIG. 14 is a schematic cross sectional view schematically showing an eighth step of the method for manufacturing the silicon carbide semiconductor device in accordance with the first embodiment of the present invention.

Next, a gate insulating film forming step (S50: FIG. 6) is performed. Referring to FIG. 14, gate insulating film 15 is formed, for example, in contact with first main surface 10a of silicon carbide substrate 10. More specifically, heat treatment of heating silicon carbide substrate 10 to about 1300° C., for example, in an oxygen atmosphere, and holding it for about one hour is performed. Thereby, gate insulating film 15 which is in contact with the body region, the source region, the drift region, and the contact region, and is made of a silicon dioxide layer is formed on first main surface 10a of silicon carbide substrate 10.

Then, a nitrogen annealing step is performed. Specifically, silicon carbide substrate 10 is held at a temperature of about 1100° C. for about one hour, for example, in a nitrogen monoxide atmosphere. Thereafter, heat treatment of heating silicon carbide substrate 10 in an inert gas such as argon or nitrogen is performed. In the heat treatment, silicon carbide substrate 10 is held at a temperature of more than or equal to 1100° C. and less than or equal to 1500° C. for about one hour.

Next, a gate electrode forming step (S60: FIG. 6) is performed. Gate electrode 27 made of polysilicon which is a conductor highly doped with an impurity is formed, for example, by a chemical vapor deposition (CVD) method, photolithography, and etching. In the step of forming gate electrode 27, gate electrode 27 is formed to overlap first body region 13a sandwiched between first source region 14a and first drift region 17a, second body region 13b sandwiched between second source region 14b and first drift region 17a, and first connection region 22a, when viewed in a plan view.

Figure 15:
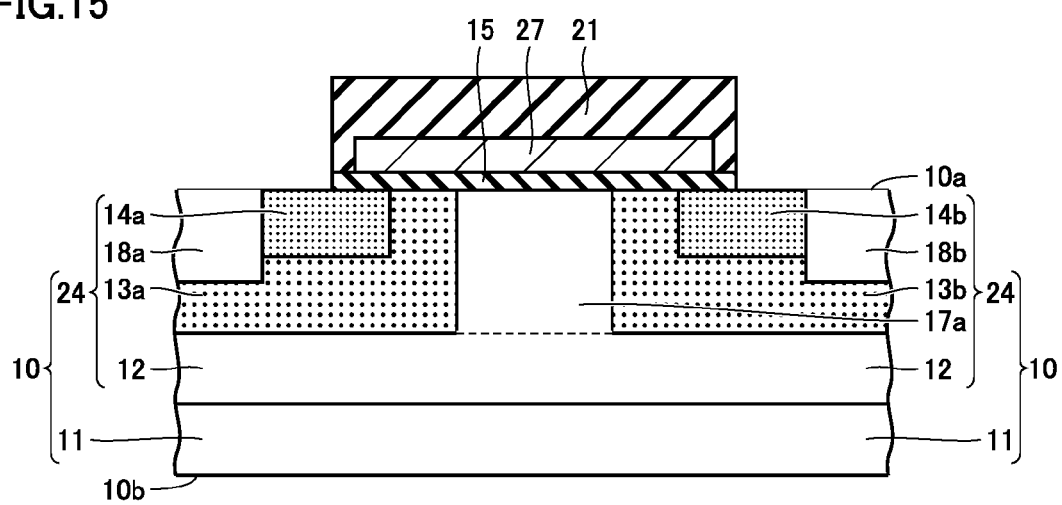
FIG. 15 is a schematic cross sectional view schematically showing a ninth step of the method for manufacturing the silicon carbide semiconductor device in accordance with the first embodiment of the present invention.

Next, an interlayer insulating film forming step (S70: FIG. 6) is performed. Interlayer insulating film 21 made of silicon dioxide which is an insulator is formed, for example, by the CVD method, to surround gate electrode 27. Next, interlayer insulating film 21 and gate insulating film 15 in a region where the source contact electrode is to be formed are removed by photolithography and etching (see FIG. 15). Next, an ohmic electrode forming step (S80: FIG. 6) is performed. Specifically, a metal film is formed, for example, by an evaporation method, on first main surface 10a of silicon carbide substrate 10, to be in contact with the source region and the contact region. The metal film is made of Ni (nickel), for example. The metal film may contain Ti (titanium) atoms and Al (aluminum) atoms, for example. The metal film may contain Ni atoms and Si (silicon) atoms, for example. After the metal film is formed, the metal film is heated at about 1000° C., for example, and thereby silicided, to form the source contact electrode which is in ohmic contact with the source region of silicon carbide substrate 10. Similarly, a metal film made of such as Ni is formed in contact with second main surface 10b of silicon carbide substrate 10, and the metal film is heated to form drain electrode 20.

Next, the source wire made of Al which is a conductor is formed, for example, by the evaporation method, to surround interlayer insulating film 21 and to be in contact with the source contact electrode. Further, the pad electrode containing Al, for example, is formed in contact with drain electrode 20. Through the above procedure, MOSFET 1 in accordance with the first embodiment (see FIG. 1) is completed.

Next, the function and effect of MOSFET 1 and the method for manufacturing the same in accordance with the first embodiment will be described.

According to MOSFET 1 in accordance with the first embodiment, first body region 13a has first straight-line portion L1 which is in contact with first drift region 17a, and second straight-line portion L2 which is located adjacent to first straight-line portion L1 and is in contact with third drift region 17c when viewed in a plan view. Second body region 13b has third straight-line portion L3 which is in contact with first drift region 17a, and fourth straight-line portion L4 which is located adjacent to third straight-line portion L3, on a side close to second straight-line portion L2, and is in contact with second drift region 17b when viewed in a plan view. First connection region 22a is provided to include first intersection 13a1 and second intersection 13b1, first intersection 13a1 being an intersection of a straight line along first straight-line portion L1 and a straight line along second straight-line portion L2, second intersection 13b1 being an intersection of a straight line along third straight-line portion L3 and a straight line along fourth straight-line portion L4, and first connection region 22a has p type. Gate electrode 27 is provided to overlap first body region 13a sandwiched between first source region 14a and first drift region 17a, second body region 13b sandwiched between second source region 14b and first drift region 17a, and first connection region 22a, when viewed in a plan view. Thereby, the switching characteristics of MOSFET 1 can be improved.

Further, according to MOSFET 1 in accordance with the first embodiment, the polygon is a hexagon. Thereby, the cell density of MOSFET 1 can be improved.

Furthermore, according to MOSFET 1 in accordance with the first embodiment, first connection region 22a has a shape that is a triangle when viewed in a plan view. Thereby, the reverse transfer capacitance of MOSFET 1 can be reduced effectively.

Furthermore, according to MOSFET 1 in accordance with the first embodiment, silicon carbide substrate 10 further includes third source region 14c and third body region 13c. Third source region 14c is located adjacent to first source region 14a and second source region 14b and has an outer shape that is a hexagon when viewed in a plan view, and has n type. Third body region 13c is formed to surround third source region 14c when viewed in a plan view, and has p type. Second drift region 17b is sandwiched between second body region 13b and third body region 13c, and is separated from third source region 14c by third body region 13c. Third drift region 17c is sandwiched between first body region 13a and third body region 13c, and is separated from first source region 14a by first body region 13a. First connection region 22a is provided to be surrounded by first body region 13a, second body region 13b, third body region 13c, first drift region 17a, second drift region 17b, and third drift region 17c when viewed in a plan view. Thereby, the reverse transfer capacitance of MOSFET 1 can be reduced more effectively.

Furthermore, according to MOSFET 1 in accordance with the first embodiment, first body region 13a further has fifth straight-line portion L5 which is located adjacent to first straight-line portion L1, on a side opposite to second straight-line portion L2, and constitutes the outer periphery of first body region 13a, when viewed in a plan view. Second body region 13b further has sixth straight-line portion L6 which is located adjacent to third straight-line portion L3, on a side opposite to fourth straight-line portion L4, and constitutes the outer periphery of second body region 13b, when viewed in a plan view. Silicon carbide substrate 10 includes second connection region 22b provided to include third intersection 13a2 and fourth intersection 13b2, third intersection 13a2 being an intersection of the straight line along first straight-line portion L1 and a straight line along fifth straight-line portion L5, fourth intersection 13b2 being an intersection of the straight line along third straight-line portion L3 and a straight line along sixth straight-line portion L6, second connection region 22b having p type. The relation B>0.5×A is satisfied, where A represents the distance from the center of first connection region 22a to the center of second connection region 22b, and B represents the minimum distance between first connection region 22a and second connection region 22b. Thereby, the reverse transfer capacitance of MOSFET 1 can be reduced effectively while securing its current density.

Furthermore, according to MOSFET 1 in accordance with the first embodiment, first connection region 22a has an impurity concentration of more than or equal to $1\times10^{16}$ cm$^{-3}$ and less than or equal to $1\times10^{20}$ cm$^{-3}$. Thereby, first connection region 22a has an impurity density higher than that of first drift region 17a, and thus the electrostatic capacitance between gate electrode 27 in first connection region 22a and first drift region 17a can be suppressed.

Furthermore, according to MOSFET 1 in accordance with the first embodiment, first connection region 22a has an impurity concentration of less than or equal to $1\times10^{19}$ cm$^{-3}$. When first connection region 22a has an impurity concentration of more than $1\times10^{19}$ cm$^{-3}$, the crystallinity of first connection region 22a is disrupted, and thus the surface of first connection region 22a is roughened. In addition, when first connection region 22a has an impurity concentration of more than $1\times10^{19}$ cm$^{-3}$, gate oxide film 15 grows on first connection region 22a at a slower speed, and thus the thickness of gate oxide film 15 on first connection region 22a is reduced. Accordingly, a leak current tends to be generated between gate electrode 27 and first connection region 22a. By setting the impurity concentration of first connection region 22a to less than or equal to $1\times10^{19}$ cm$^{-3}$, roughening of the surface of first connection region 22a can be suppressed, and the thickness of gate oxide film 15 on first connection region 22a can be increased. As a result, generation of a leak current between gate electrode 27 and first connection region 22a can be suppressed effectively.

Furthermore, according to MOSFET 1 in accordance with the first embodiment, the thickness of first connection region 22a along the direction of the normal to first main surface 10a is less than or equal to the thickness of each of first body region 13a and second body region 13b. This can suppress an electric field from concentrating on the bottom portion of first connection region 22a.

Furthermore, according to MOSFET 1 in accordance with the first embodiment, first connection region 22a has an impurity concentration identical to that of each of first body region 13a and second body region 13b. Thereby, first connection region 22a can be formed simultaneously with first body region 13a and second body region 13b.

Furthermore, according to MOSFET 1 in accordance with the first embodiment, the first conductivity type is n type, and the second conductivity type is p type. This facilitates the manufacturing process of MOSFET 1.

According to the method for manufacturing MOSFET 1 in accordance with the first embodiment, first body region 13a has first straight-line portion L1 which is in contact with first drift region 17a, and second straight-line portion L2 which is located adjacent to first straight-line portion L1 and is in contact with third drift region 17c when viewed in a plan view. Second body region 13b has third straight-line portion L3 which is in contact with first drift region 17a, and fourth straight-line portion L4 which is located adjacent to third straight-line portion L3, on a side close to second straight-line portion L2, and is in contact with second drift region 17b when viewed in a plan view. First connection region 22a is provided to include first intersection 13a1 and second intersection 13b1, first intersection 13a1 being an intersection of a straight line along first straight-line portion L1 and a straight line along second straight-line portion L2, second intersection 13b1 being an intersection of a straight line along third straight-line portion L3 and a straight line along fourth straight-line portion L4, and first connection region 22a has p type. Gate electrode 27 is provided to overlap first body region 13a sandwiched between first source region 14a and first drift region 17a, second body region 13b sandwiched between second source region 14b and first drift region 17a, and first connection region 22a, when viewed in a plan view. Thereby, the switching characteristics of MOSFET 1 can be improved.

Further, according to the method for manufacturing MOSFET 1 in accordance with the first embodiment, silicon carbide substrate 10 further includes first contact region 18a which is surrounded by first source region 14a when viewed in a plan view and has p type, and second contact region 18b which is surrounded by second source region 14b when viewed in a plan view and has p type. The step of preparing silicon carbide substrate 10 includes the step of simultaneously forming first connection region 22a, first contact region 18a, and second contact region 18b. This simplifies the manufacturing process of MOSFET 1.

Furthermore, according to the method for manufacturing MOSFET 1 in accordance with the first embodiment, the step of preparing silicon carbide substrate 10 further includes the steps of forming first mask layer 31 on first main surface 10a of silicon carbide substrate 10, forming second mask layer 32 which is in contact with first mask layer 31 on silicon carbide substrate 10, and forming first source region 14a and second source region 14b using first mask layer 31 and second mask layer 32. The step of simultaneously forming first connection region 22a, first contact region 18a, and second contact region 18b is performed after the step of forming first source region 14a and second source region 14b. Thereby, first source region 14a and second source region 14b are formed using a self-alignment step, and thus first source region 14a and second source region 14b have an improved alignment accuracy.

(Second Embodiment)

Next, a method for manufacturing MOSFET 1 in accordance with a second embodiment will be described. The method for manufacturing MOSFET 1 in accordance with the second embodiment is different from the method for manufacturing the MOSFET in accordance with the first embodiment in that the connection region is formed simultaneously with the body region in the first p type region forming step (S20: FIG. 6), and only the contact region is formed in the second p type region forming step (S40: FIG. 6). For other steps, the method for manufacturing MOSFET 1 in accordance with the second embodiment is the same as the method for manufacturing MOSFET 1 in accordance with the first embodiment. Hereinafter, a description will be given focusing on the difference from the method for manufacturing the MOSFET in accordance with the first embodiment.

First, the silicon carbide substrate preparation step (S10: FIG. 6) is performed. Specifically, silicon carbide substrate 10 having first main surface 10a and second main surface 10b opposite to first main surface 10a and having the first conductivity type is prepared by the same method as that described in the first embodiment.

Next, the first p type region forming step (S20: FIG. 6) is performed. Specifically, referring to FIG. 8, first mask layer 31 having openings at desired regions where ion implantation should be performed is formed on first main surface 10a of drift layer 12. First mask layer 31 is made of, for example, silicon dioxide. Next, Al (aluminum) ions, for example, are implanted into drift layer 12 using first mask layer 31, to form the body region and the connection region. Specifically, a p type region 28 in which first body region 13a, second body region 13b, third body region 13c, fourth body region 13d, first connection region 22a, second connection region 22b, and third connection region 22c are integrated is formed in contact with the drift layer. The thickness of each of first connection region 22a, second connection region 22b, and third connection region 22c along the direction of the normal to first main surface 10a is almost the same as the thickness of each of first body region 13a, second body region 13b, third body region 13c, and fourth body region 13d along the direction of the normal to first main surface 10a. Each of first connection region 22a, second connection region 22b, and third connection region 22c has almost the same impurity concentration as that of each of first body region 13a, second body region 13b, third body region 13c, and fourth body region 13d. Next, first mask layer 31 is removed by a method such as etching.

Figure 16:
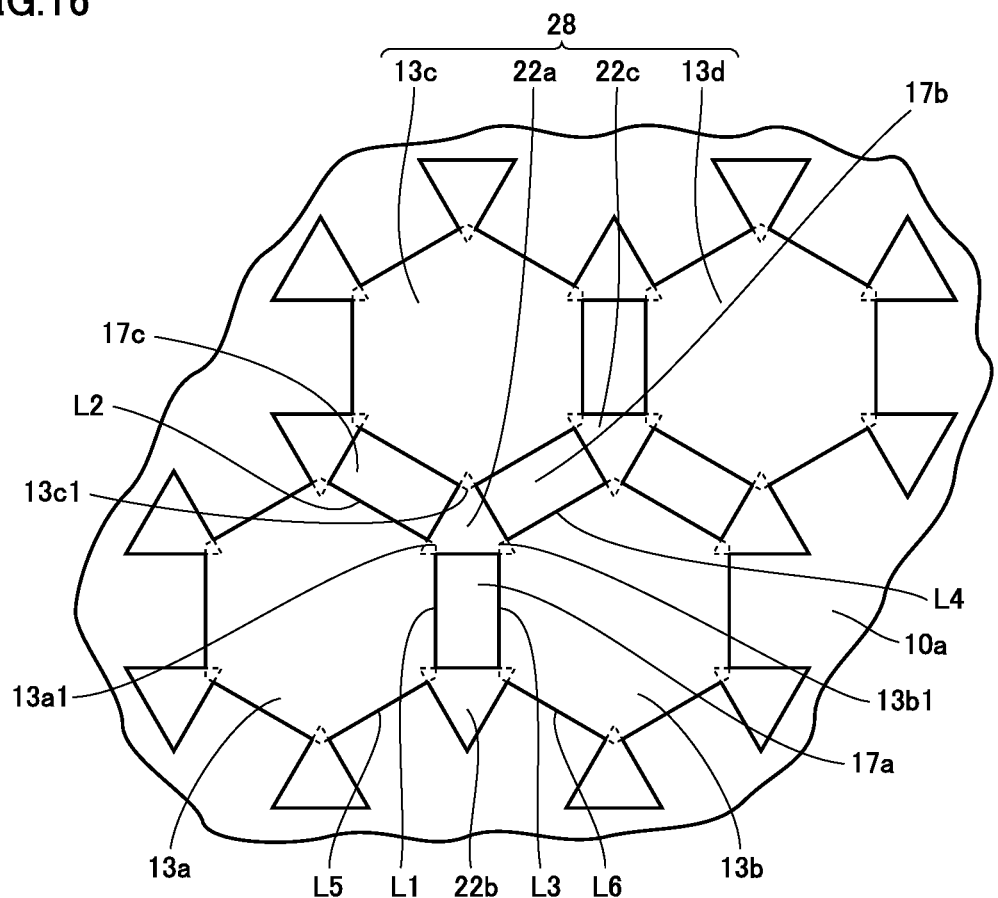
FIG. 16 is a schematic plan view schematically showing a third step of a method for manufacturing a silicon carbide semiconductor device in accordance with a second embodiment of the present invention.

Referring to FIG. 16, when viewed in a plan view, each of first body region 13a, second body region 13b, and third body region 13c has an outer shape that is substantially a hexagon. First connection region 22a is formed to connect first body region 13a, second body region 13b, and third body region 13c.

As shown in FIG. 16, first body region 13a has first straight-line portion L1 which is in contact with first drift region 17a, second straight-line portion L2 which is located adjacent to first straight-line portion L1 and is in contact with third drift region 17c when viewed in a plan view, and fifth straight-line portion L5 which is located adjacent to first straight-line portion L1, on a side opposite to second straight-line portion L2, when viewed in a plan view. First straight-line portion L1, second straight-line portion L2, and fifth straight-line portion L5 constitute the outer periphery of first drift region 17a. Second body region 13b has third straight-line portion L3 which is in contact with first drift region 17a, fourth straight-line portion L4 which is located adjacent to third straight-line portion L3, on a side close to second straight-line portion L2, and is in contact with second drift region 17b when viewed in a plan view, and sixth straight-line portion L6 which is located adjacent to third straight-line portion L3, on a side opposite to fourth straight-line portion L4, when viewed in a plan view. Third straight-line portion L3, fourth straight-line portion L4, and sixth straight-line portion L6 constitute the outer periphery of second drift region 17b.

First connection region 22a is formed to include first intersection 13a1 and second intersection 13b1, first intersection 13a1 being an intersection of a straight line along first straight-line portion L1 and a straight line along second straight-line portion L2, second intersection 13b1 being an intersection of a straight line along third straight-line portion L3 and a straight line along fourth straight-line portion L4. First connection region 22a is formed to be surrounded by first body region 13a, second body region 13b, third body region 13c, first drift region 17a, second drift region 17b, and third drift region 17c when viewed in a plan view.

Second connection region 22b is formed to include third intersection 13a2 and fourth intersection 13b2, third intersection 13a2 being an intersection of the straight line along first straight-line portion L1 and a straight line along fifth straight-line portion L5, fourth intersection 13b2 being an intersection of the straight line along third straight-line portion L3 and a straight line along sixth straight-line portion L6. When viewed in a plan view, each of first connection region 22a, second connection region 22b, and third connection region 22c has an outer shape that is a triangle, and preferably has an outer shape that is a regular triangle.

Figure 17:
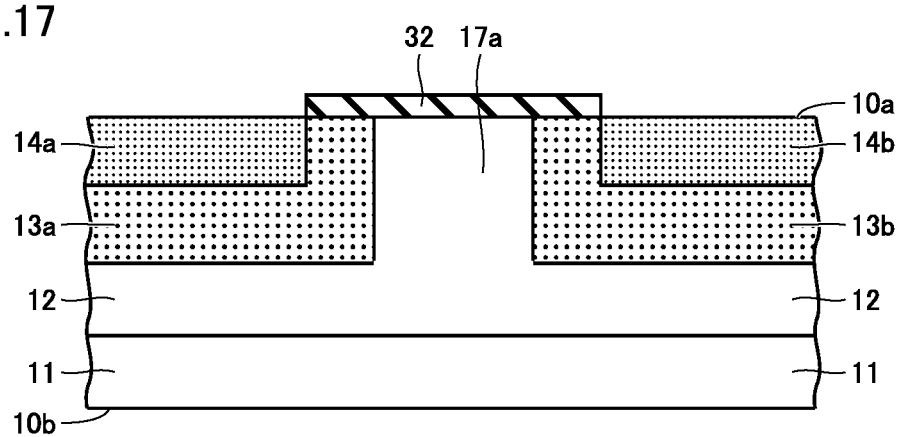
FIG. 17 is a schematic cross sectional view schematically showing a fourth step of the method for manufacturing the silicon carbide semiconductor device in accordance with the second embodiment of the present invention.

Next, the n type region forming step (S30: FIG. 6) is performed. Specifically, referring to FIG. 17, first mask layer 31 formed on first main surface 10a of silicon carbide substrate 10 is removed, and thereafter second mask layer 32 having openings at desired regions where ion implantation should be performed is formed. Second mask layer 32 is provided in contact with the drift region and the body region. Next, P (phosphorus) ions, for example, are implanted into first body region 13a and second body region 13b using second mask layer 32, to form first source region 14a within first body region 13a and to form second source region 14b within second body region 13b. The outer shape of each of first source region 14a and second source region 14b is a polygon, preferably a hexagon, and more preferably a regular hexagon. Next, second mask layer 32 is removed for example by etching.

Next, the second p type region forming step (S40: FIG. 6) is performed. Specifically, the third mask layer (not shown) having openings in the contact region is formed on first main surface 10a of silicon carbide substrate 10. Al ions, for example, are implanted into the source region using the third mask layer described above, to form the contact region within the source region. Specifically, first contact region 18a, second contact region 18b, third contact region 18c, and fourth contact region 18d are formed within first source region 14a, second source region 14b, third source region 14c, and fourth source region 14d, respectively (see FIG. 13).

Next, the activation annealing step, the gate insulating film 15 forming step (S50: FIG. 6), the nitrogen annealing step, the gate electrode 27 forming step (S60: FIG. 6), the interlayer insulating film 21 forming step (S70: FIG. 6), the ohmic electrode forming step (S80: FIG. 6), and the like are performed by the same methods as those described in the first embodiment. Through the above procedure, MOSFET 1 in accordance with the second embodiment is completed.

Next, the function and effect of MOSFET 1 and the method for manufacturing the same in accordance with the second embodiment will be described.

According to MOSFET 1 in accordance with the second embodiment, MOSFET 1 further includes first contact region 18a which is surrounded by first source region 14a when viewed in a plan view and has p type, and second contact region 18b which is surrounded by second source region 14b when viewed in a plan view and has p type. First connection region 22a has an impurity concentration identical to that of each of first contact region 18a and second contact region 18b. Thereby, first connection region 22a can be formed simultaneously with first contact region 18a and second contact region 18b.

According to MOSFET 1 in accordance with the second embodiment, the step of preparing silicon carbide substrate 10 includes the step of simultaneously forming first connection region 22a, first body region 13a, and second body region 13b. This simplifies the manufacturing process of MOSFET 1.

Further, according to MOSFET 1 in accordance with the second embodiment, the step of preparing silicon carbide substrate 10 includes the step of forming the first mask layer on first main surface 10a of silicon carbide substrate 10. First connection region 22a, first body region 13a, and second body region 13b are formed using first mask layer 31. First mask layer 31 is removed. The second mask layer is formed on first main surface 10a of silicon carbide substrate 10. First source region 14a and second source region 14b are formed using second mask layer 32. Thereby, MOSFET 1 can be manufactured efficiently.

(Third Embodiment)

Next, a configuration of MOSFET 1 in accordance with a third embodiment will be described. The configuration of MOSFET 1 in accordance with the third embodiment is different from the configuration of the MOSFET in accordance with the first embodiment in that the thickness of the gate oxide film on the first connection region is larger than the thickness of the gate oxide film on each of the first body region and the second body region. Other than that, the configuration of MOSFET 1 in accordance with the third embodiment is the same as the configuration of MOSFET 1 in accordance with the first embodiment. Hereinafter, a description will be given focusing on the difference from the configuration of the MOSFET in accordance with the first embodiment.

Figure 18:
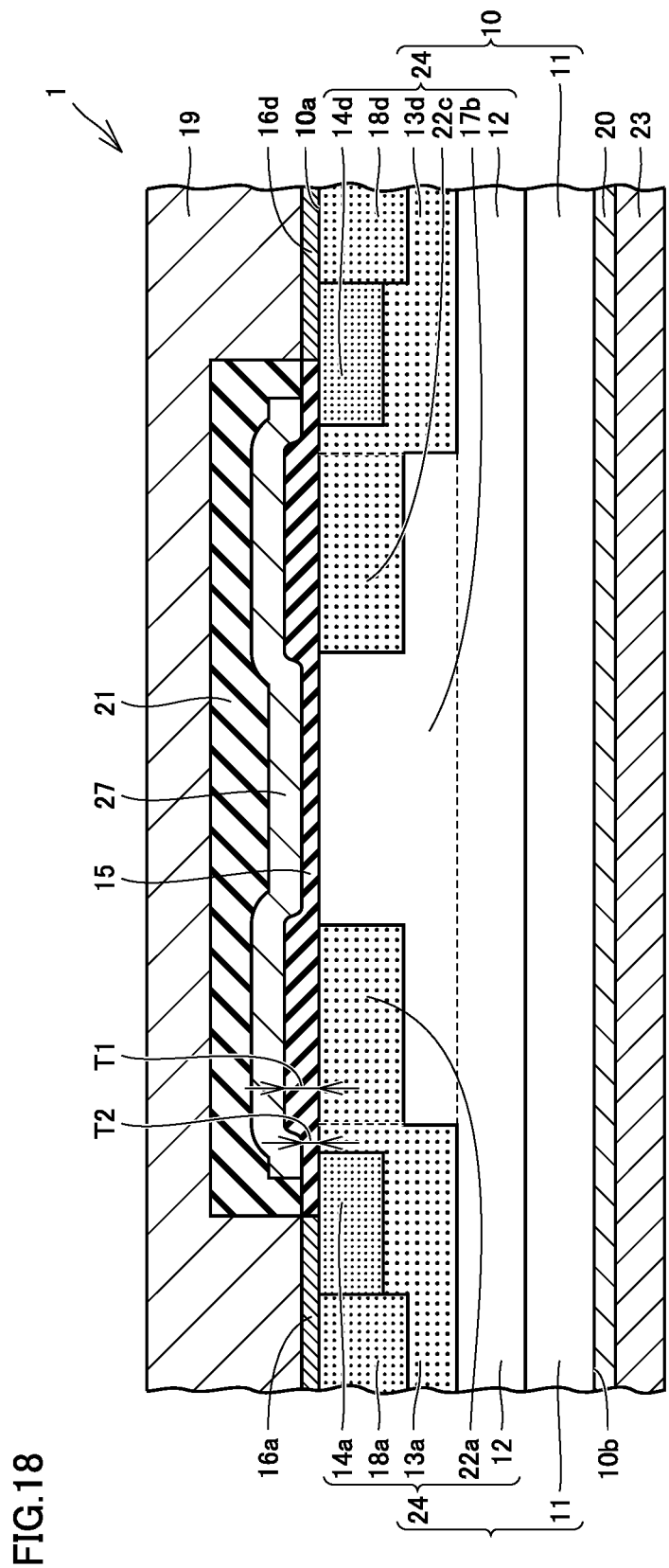
FIG. 18 is a schematic cross sectional view schematically showing a structure of a silicon carbide semiconductor device in accordance with a third embodiment of the present invention.

Referring to FIGS. 18 and 1, the configuration of the MOSFET in accordance with the third embodiment will be described. FIG. 18 is a schematic cross sectional view in region III-III in FIG. 2. Gate oxide film 15 of MOSFET 1 is provided to be sandwiched between gate electrode 27 and each of first connection region 22a, first body region 13a, and second body region 13b. Thickness T1 of gate oxide film 15 on first connection region 22a is larger than a thickness T2 of gate oxide film 15 on each of first body region 13a and second body region 13b. In other words, thickness T1 of gate oxide film 15 sandwiched between gate electrode 27 and first connection region 22a is larger than thickness T2 of gate oxide film 15 sandwiched between gate electrode 27 and each of first body region 13a and second body region 13b. Thickness T1 of gate oxide film 15 on first connection region 22a is about 70 nm, for example, and thickness T2 of gate oxide film 15 on each of first body region 13a and second body region 13b is about 50 nm, for example. Thickness T1 of gate oxide film 15 on first connection region 22a may be, for example, more than or equal to about 70 nm and less than or equal to about 500 nm. Thickness T1 of gate oxide film 15 on first connection region 22a may be smaller than a thickness of gate oxide film 15 on second drift region 17b sandwiched between first connection region 22a and third connection region 22c, when viewed in a cross sectional view. Preferably, thickness T1 of gate oxide film 15 on each of first connection region 22a, second connection region 22b, third connection region 22c, and fourth connection region 22d is larger than thickness T2 of gate oxide film 15 on each of first body region 13a, second body region 13b, third body region 13c, and fourth body region 13d.

Gate electrode 27 is provided on gate oxide film 15 located on first body region 13a, second body region 13b, third body region 13c, fourth body region 13d, first connection region 22a, second connection region 22b, third connection region 22c, and fourth connection region 22d. A portion of gate oxide film 15 at a position facing each of first connection region 22a, second connection region 22b, third connection region 22c, and fourth connection region 22d may be arranged at a position farther from first main surface 10a of silicon carbide substrate 10, than a portion of gate electrode 27 at a position facing each of first body region 13a, second body region 13b, third body region 13c, and fourth body region 13d.

Next, a method for manufacturing MOSFET 1 in accordance with the third embodiment will be described. The method for manufacturing MOSFET 1 in accordance with the third embodiment is different from the methods for manufacturing the MOSFET in accordance with the first and second embodiments in that the method includes steps of forming a silicon dioxide layer or a polysilicon layer on the first connection region of the silicon carbide substrate, and performing thermal oxidation on the first main surface of the silicon carbide substrate having the silicon dioxide layer or the polysilicon layer formed thereon. For other steps, the method for manufacturing MOSFET 1 in accordance with the third embodiment is substantially the same as the methods for manufacturing the MOSFET in accordance with the first and second embodiments. Hereinafter, a description will be given focusing on the difference from the methods for manufacturing the MOSFET in accordance with the first and second embodiments.

Next, an example of the method for manufacturing MOSFET 1 in the present embodiment will be described with reference to FIG. 6.

First, the silicon carbide substrate preparation step (S10: FIG. 6), the first p type region forming step (S20: FIG. 6), the n type region forming step (S30: FIG. 6), and the second p type region forming step (S40: FIG. 6) are performed by the same methods as those described in the first embodiment or the second embodiment, to prepare the silicon carbide substrate which includes the drift region having n type, the body region in contact with the drift region and having p type, the source region separated from the drift region by the body region and having n type, the contact region in contact with the body region and the source region, and the connection region.

Figure 19:
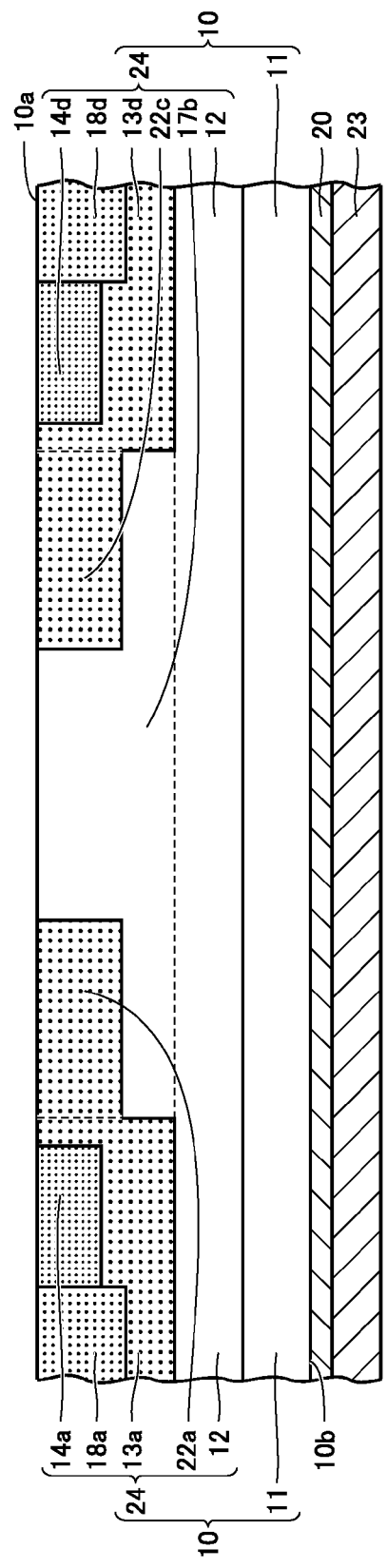
FIG. 19 is a schematic cross sectional view schematically showing a seventh step of a method for manufacturing the silicon carbide semiconductor device in accordance with the third embodiment of the present invention.

Referring to FIG. 19, silicon carbide substrate 10 includes first source region 14a, fourth source region 14d, first body region 13a, fourth body region 13d, second drift region 17b, first connection region 22a, and third connection region 22c. First body region 13a is formed to surround first source region 14a when viewed in a plan view, and has p type. Fourth body region 13d is formed to surround fourth source region 14d when viewed in a plan view, and has p type. Second drift region 17b is sandwiched between first body region 13a and fourth body region 13d, is separated from first source region 14a by first body region 13a, is separated from fourth source region 14d by fourth body region 13d, and has n type. When viewed in a cross sectional view, first connection region 22a is provided to be sandwiched between first body region 13a and second drift region 17b. Third connection region 22c is provided to be sandwiched between fourth body region 13d and second drift region 17b.

Next, the activation annealing step is performed. Specifically, heat treatment of heating silicon carbide substrate 10 described above to about 1700° C., for example, in an atmosphere of an inert gas such as argon, for example, and holding it for about 30 minutes is performed. Thereby, the implanted impurities are activated.

Next, the gate insulating film forming step (S50: FIG. 6) is performed. In the present embodiment, the step of forming the gate insulating film (gate oxide film) includes the steps of forming a silicon dioxide layer or a polysilicon layer on the first connection region of the silicon carbide substrate, and performing thermal oxidation on the first main surface of the silicon carbide substrate having the silicon dioxide layer or the polysilicon layer formed thereon.

Figure 20:
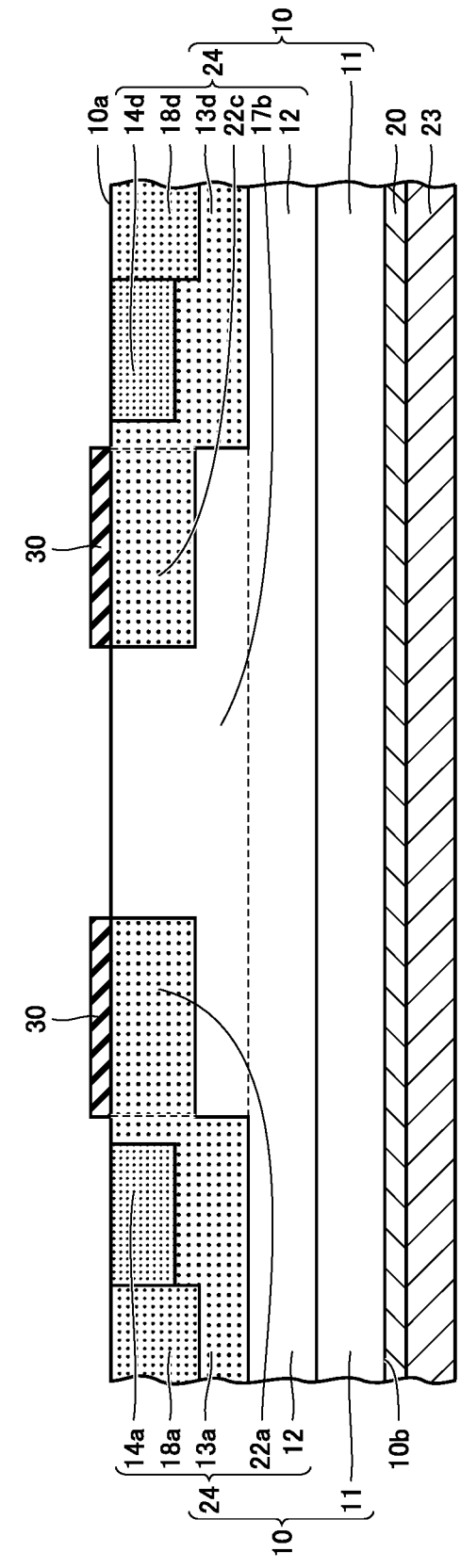
FIG. 20 is a schematic cross sectional view schematically showing a step between the seventh step and an eighth step of the method for manufacturing the silicon carbide semiconductor device in accordance with the third embodiment of the present invention.

Referring to FIG. 20, silicon dioxide layer 30 or polysilicon layer 30 is formed for example by CVD, on each of first connection region 22a and third connection region 22c. Preferably, silicon dioxide layer 30 or polysilicon layer 30 is formed to cover the entire surface of a region of each of first connection region 22a, second connection region 22b, third connection region 22c, and fourth connection region 22d which is in contact with first main surface 10a of silicon carbide substrate 10. Silicon dioxide layer 30 and polysilicon layer 30 are not formed on a region which serves as channel region CH (see FIG. 1) within the body region. Preferably, silicon dioxide layer 30 and polysilicon layer 30 are not formed on each of first body region 13a, first source region 14a, first contact region 18a, second drift region 17b, fourth body region 13d, fourth source region 14d, and fourth contact region 18d.

Figure 21:
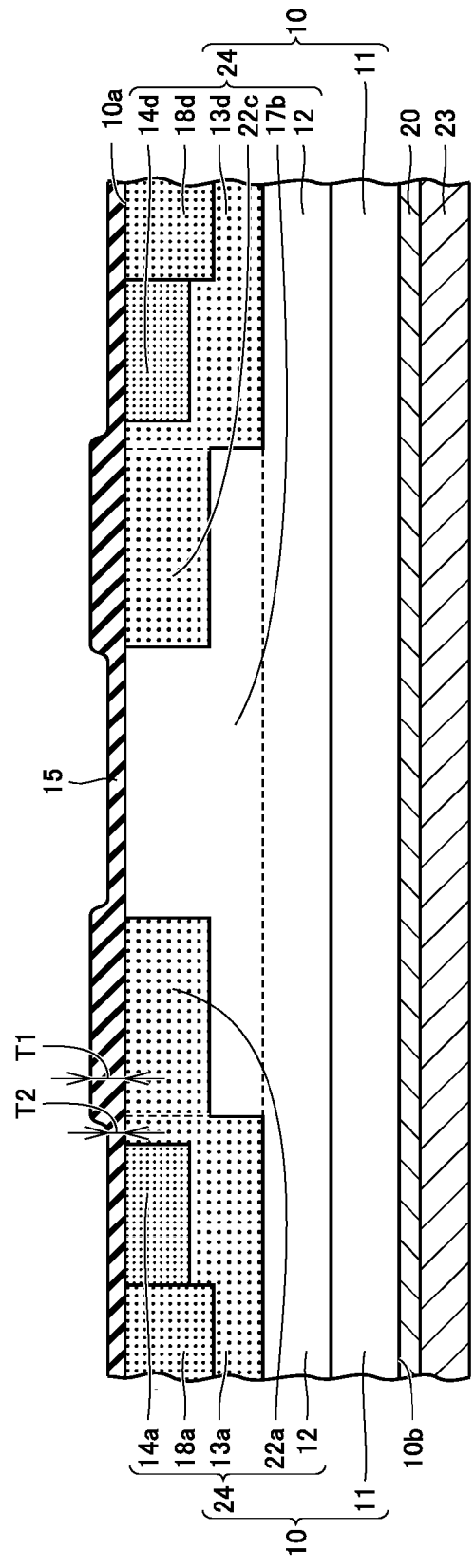
FIG. 21 is a schematic cross sectional view schematically showing the eighth step of the method for manufacturing the silicon carbide semiconductor device in accordance with the third embodiment of the present invention.

Next, silicon carbide substrate 10 having silicon dioxide layer 30 or polysilicon layer 30 formed thereon is subjected to thermal oxidation. Specifically, heat treatment of heating silicon carbide substrate 10 having silicon dioxide layer 30 or polysilicon layer 30 formed thereon to about 1300° C., for example, in an oxygen atmosphere, and holding it for about one hour is performed. Thereby, silicon dioxide layer 30 or polysilicon layer 30 formed on each of first connection region 22a and third connection region 22c, and first main surface 10a of silicon carbide substrate 10 are oxidized, to form gate oxide film 15 which is in contact with first body region 13a, first source region 14a, first contact region 18a, second drift region 17b, fourth body region 13d, fourth source region 14d, fourth contact region 18d, first connection region 22a, and third connection region 22c (see FIG. 21). Thickness T1 of gate oxide film 15 on each of first connection region 22a and third connection region 22c is larger than thickness T2 of gate oxide film 15 on each of first body region 13a and fourth body region 13d. Thickness T1 of gate oxide film 15 on each of first connection region 22a and third connection region 22c is about 70 nm, for example, and thickness T2 of gate oxide film 15 on each of first body region 13a and fourth body region 13d is about 50 nm, for example.

Next, the nitrogen annealing step is performed. Specifically, silicon carbide substrate 10 is held at a temperature of about 1100° C. for about one hour, for example, in a nitrogen monoxide atmosphere. Thereafter, heat treatment of heating silicon carbide substrate 10 in an inert gas such as argon or nitrogen is performed. In the heat treatment, silicon carbide substrate 10 is held at a temperature of more than or equal to 1100° C. and less than or equal to 1500° C. for about one hour.

Next, the gate electrode forming step (S60: FIG. 6), the interlayer insulating film forming step (S70: FIG. 6), and the ohmic electrode forming step (S80: FIG. 6) are performed by the same methods as those described in the first embodiment. Through the above procedure, MOSFET 1 in accordance with the third embodiment (see FIG. 18) is completed.

Next, the function and effect of MOSFET 1 and the method for manufacturing the same in accordance with the third embodiment will be described.

According to MOSFET 1 in accordance with the present embodiment, MOSFET 1 further includes gate oxide film 15 provided to be sandwiched between gate electrode 27 and each of first connection region 22a, first body region 13a, and second body region 13b. Thickness T1 of gate oxide film 15 on first connection region 22a is larger than the thickness of gate oxide film 15 on each of first body region 13a and second body region 13b. Thereby, generation of a leak current between gate electrode 27 and first connection region 22a can be suppressed effectively, even when the crystallinity of first connection region 22a is disrupted and thus the surface of first connection region 22a is roughened.

According to the method for manufacturing MOSFET 1 in accordance with the present embodiment, the method further includes the step of forming gate oxide film 15 which is in contact with each of first connection region 22a, first body region 13a, and second body region 13b. The step of forming gate oxide film 15 includes the steps of forming silicon dioxide layer 30 or polysilicon layer 30 on first connection region 22a of silicon carbide substrate 10, and performing thermal oxidation on first main surface 10a of silicon carbide substrate 10 having silicon dioxide layer 30 or polysilicon layer 30 formed thereon. Thereby, the thickness of gate oxide film 15 on first connection region 22a can be larger than the thickness of gate oxide film 15 on each of first body region 13a and second body region 13b. As a result, generation of a leak current between gate electrode 27 and first connection region 22a can be suppressed effectively, even when the crystallinity of first connection region 22a is disrupted and thus the surface of first connection region 22a is roughened.

It should be noted that, although the description has been given in each of the embodiments described above for the case where the first conductivity type is n type and the second conductivity type is p type, the present invention is not limited thereto. For example, the first conductivity type may be p type and the second conductivity type may be n type.

Further, although a MOSFET has been described as an example of silicon carbide semiconductor device 1 in each of the embodiments described above, the present invention is not limited thereto. Silicon carbide semiconductor device 1 may also be, for example, an insulated gate bipolar transistor (IGBT) or the like.

Furthermore, although the first embodiment has described the case where the connection region is formed simultaneously with the contact region, and the second embodiment has described the case where the connection region is formed simultaneously with the body region, the present invention is not limited thereto. For example, the connection region may be formed in a step different from the step of forming the body region and the step of forming the contact region.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST

1: silicon carbide semiconductor device (MOSFET); 10: silicon carbide substrate; 10a: first main surface; 10b: second main surface; 11: base substrate; 12: drift layer; 13a: first body region; 13a1: first intersection; 13a2: third intersection; 13b: second body region; 13b1: second intersection; 13b2: fourth intersection; 13c: third body region; 13d: fourth body region; 14a: first source region; 14b: second source region; 14c: third source region; 14d: fourth source region; 15: gate insulating film (gate oxide film); 16a: first source contact electrode; 16b: second source contact electrode; 17a: first drift region; 17b: second drift region; 17c: third drift region; 17d: fourth drift region; 18a: first contact region; 18b: second contact region; 18c: third contact region; 18d: fourth contact region; 19: source wire; 20: drain electrode; 21: interlayer insulating film; 22a: first connection region; 22b: second connection region; 22c: third connection region; 22d: fourth connection region; 23: pad electrode; 24: silicon carbide epitaxial layer; 25a: triple point; 27: gate electrode; 28: p type region; 30: silicon dioxide layer (polysilicon layer); 31: first mask layer; 32: second mask layer; A, B: distance; CH: channel region; CL: cell; Cgd, Cgs1, Cgs2: electrostatic capacitance; H1, H2: thickness; L1: first straight-line portion; L2: second straight-line portion; L3: third straight-line portion; L4: fourth straight-line portion; L5: fifth straight-line portion; L6: sixth straight-line portion; T1, T2: thickness.

The invention claimed is:

1. A silicon carbide semiconductor device, comprising:
  a silicon carbide substrate having a first main surface and a second main surface opposite to said first main surface; and
  a gate electrode provided on a side of said first main surface of said silicon carbide substrate, wherein
  said silicon carbide substrate includes
    a first source region and a second source region which are adjacent to each other and have an outer shape that is a polygon when viewed in a plan view, and have a first conductivity type,
    a first body region which is formed to surround said first source region when viewed in a plan view, and has a second conductivity type,
    a second body region which is formed to surround said second source region when viewed in a plan view, and has said second conductivity type,
    a first drift region which is sandwiched between said first body region and said second body region, is separated from said first source region by said first body region, is separated from said second source region by said second body region, and has said first conductivity type, a second drift region which is in contact with said second body region, is separated from said second source region by said second body region, and has said first conductivity type, and a third drift region which is in contact with said first body region, is separated from said first source region by said first body region, and has said first conductivity type, said first body region having a first straight-line portion which is in contact with said first drift region, and a second straight-line portion which is located adjacent to said first straight-line portion and is in contact with said third drift region when viewed in a plan view, said second body region having a third straight-line portion which is in contact with said first drift region, and a fourth straight-line portion which is located adjacent to said third straight-line portion, on a side close to said second straight-line portion, and is in contact with said second drift region when viewed in a plan view, said silicon carbide substrate further includes a first connection region provided to include a first intersection and a second intersection, said first intersection being an intersection of a straight line along said first straight-line portion and a straight line along said second straight-line portion, said second intersection being an intersection of a straight line along said third straight-line portion and a straight line along said fourth straight-line portion, said first connection region having said second conductivity type, and said gate electrode is provided to overlap said first body region sandwiched between said first source region and said first drift region, said second body region sandwiched between said second source region and said first drift region, and said first connection region, when viewed in a plan view, said first body region further has a fifth straight-line portion which is located adjacent to said first straight-line portion, on a side opposite to said second straight-line portion, and constitutes an outer periphery of said first body region, when viewed in a plan view, said second body region further has a sixth straight-line portion which is located adjacent to said third straight-line portion, on a side opposite to said fourth straight-line portion, and constitutes an outer periphery of said second body region, when viewed in a plan view, said silicon carbide substrate includes a second connection region provided to include a third intersection and a fourth intersection, said third intersection being an intersection of the straight line along said first straight-line portion and a straight line along said fifth straight-line portion, said fourth intersection being an intersection of the straight line along said third straight-line portion and a straight line along said sixth straight-line portion, said second connection region having said second conductivity type, and a relation B>0.5×A is satisfied, where A represents a distance from the center of said first connection region to the center of said second connection region, and B represents a minimum distance between said first connection region and said second connection region, when viewed in a plan view.

2. The silicon carbide semiconductor device according to claim 1, wherein said polygon is a hexagon.

3. The silicon carbide semiconductor device according to claim 2, wherein said first connection region has a shape that is a triangle when viewed in a plan view.

4. The silicon carbide semiconductor device according to claim 2, wherein said silicon carbide substrate further includes
a third source region which is located adjacent to said first source region and said second source region and has an outer shape that is a hexagon when viewed in a plan view, and has the first conductivity type, and
a third body region which is formed to surround said third source region when viewed in a plan view, and has said second conductivity type, said second drift region is sandwiched between said second body region and said third body region, and is separated from said third source region by said third body region, said third drift region is sandwiched between said first body region and said third body region, and is separated from said first source region by said first body region, and said first connection region is provided to be surrounded by said first body region, said second body region, said third body region, said first drift region, said second drift region, and said third drift region when viewed in a plan view.

5. The silicon carbide semiconductor device according to claim 1, wherein said first connection region has an impurity concentration of more than or equal to $1\times10^{16}$ cm$^{-3}$ and less than or equal to $1\times10^{20}$ cm$^{-3}$.

6. The silicon carbide semiconductor device according to claim 5, wherein said first connection region has an impurity concentration of less than or equal to $1\times10^{19}$ cm$^{-3}$.

7. The silicon carbide semiconductor device according to claim 1, wherein a thickness of said first connection region along a direction of a normal to said first main surface is less than or equal to a thickness of each of said first body region and said second body region.

8. The silicon carbide semiconductor device according to claim 1, further comprising:
a first contact region which is surrounded by said first source region when viewed in a plan view and has the second conductivity type; and
a second contact region which is surrounded by said second source region when viewed in a plan view and has the second conductivity type, wherein
said first connection region has an impurity concentration identical to that of each of said first contact region and said second contact region.

9. The silicon carbide semiconductor device according to claim 1, wherein said first connection region has an impurity concentration identical to that of each of said first body region and said second body region.

10. The silicon carbide semiconductor device according to claim 1, further comprising a gate oxide film provided to be sandwiched between said gate electrode and each of said first connection region, said first body region, and said second body region, wherein
a thickness of said gate oxide film on said first connection region is larger than a thickness of said gate oxide film on each of said first body region and said second body region.

11. The silicon carbide semiconductor device according to claim 1, wherein said first conductivity type is n type, and said second conductivity type is p type.

12. A method for manufacturing a silicon carbide semiconductor device, comprising steps of:
preparing a silicon carbide substrate having a first main surface and a second main surface opposite to said first main surface; and
forming a gate electrode on a side of said first main surface of said silicon carbide substrate,
said silicon carbide substrate includes
a first source region and a second source region which are adjacent to each other and have an outer shape that is a polygon when viewed in a plan view, and have a first conductivity type,
a first body region which is formed to surround said first source region when viewed in a plan view, and has a second conductivity type,
a second body region which is formed to surround said second source region when viewed in a plan view, and has said second conductivity type,
a first drift region which is sandwiched between said first body region and said second body region, is separated from said first source region by said first body region, is separated from said second source region by said second body region, and has said first conductivity type,
a second drift region which is in contact with said second body region, is separated from said second source region by said second body region, and has said first conductivity type, and
a third drift region which is in contact with said first body region, is separated from said first source region by said first body region, and has said first conductivity type,
said first body region having a first straight-line portion which is in contact with said first drift region, and a second straight-line portion which is located adjacent to said first straight-line portion and is in contact with said third drift region when viewed in a plan view,
said second body region having a third straight-line portion which is in contact with said first drift region, and a fourth straight-line portion which is located adjacent to said third straight-line portion, on a side close to said second straight-line portion, and is in contact with said second drift region when viewed in a plan view,
said silicon carbide substrate further includes a first connection region provided to include a first intersection and a second intersection, said first intersection being an intersection of a straight line along said first straight-line portion and a straight line along said second straight-line portion, said second intersection being an intersection of a straight line along said third straight-line portion and a straight line along said fourth straight-line portion, said first connection region having said second conductivity type, and
in the step of forming said gate electrode, said gate electrode is formed to overlap said first body region sandwiched between said first source region and said first drift region, said second body region sandwiched between said second source region and said first drift region, and said first connection region, when viewed in a plan view,
said first body region further has a fifth straight-line portion which is located adjacent to said first straight-line portion, on a side opposite to said second straight-line portion, and constitutes an outer periphery of said first body region, when viewed in a plan view,
said second body region further has a sixth straight-line portion which is located adjacent to said third straight-line portion, on a side opposite to said fourth straight-line portion, and constitutes an outer periphery of said second body region, when viewed in a plan view,
said silicon carbide substrate includes a second connection region provided to include a third intersection and a fourth intersection, said third intersection being an intersection of the straight line along said first straight-line portion and a straight line along said fifth straight-line portion, said fourth intersection being an intersection of the straight line along said third straight-line portion and a straight line along said sixth straight-line portion, said second connection region having said second conductivity type, and
a relation $B > 0.5 \times A$ is satisfied, where A represents a distance from the center of said first connection region to the center of said second connection region, and B represents a minimum distance between said first connection region and said second connection region, when viewed in a plan view.

13. The method for manufacturing the silicon carbide semiconductor device according to claim 12, wherein the step of preparing said silicon carbide substrate includes a step of simultaneously forming said first connection region, said first body region, and said second body region.

14. The method for manufacturing the silicon carbide semiconductor device according to claim 13, wherein
the step of preparing said silicon carbide substrate includes a step of forming a first mask layer on said first main surface of said silicon carbide substrate,
said first connection region, said first body region, and said second body region are formed using said first mask layer, and
the step of preparing said silicon carbide substrate further includes steps of
removing said first mask layer,
forming a second mask layer on said first main surface of said silicon carbide substrate, and
forming said first source region and said second source region using said second mask layer.

15. The method for manufacturing the silicon carbide semiconductor device according to claim 12, wherein
said silicon carbide substrate further includes a first contact region which is surrounded by said first source region when viewed in a plan view and has the second conductivity type, and a second contact region which is surrounded by said second source region when viewed in a plan view and has the second conductivity type, and
the step of preparing said silicon carbide substrate includes a step of simultaneously forming said first connection region, said first contact region, and said second contact region.

16. The method for manufacturing the silicon carbide semiconductor device according to claim 15, wherein
the step of preparing said silicon carbide substrate further includes steps of
forming a first mask layer on said first main surface of said silicon carbide substrate,
forming a second mask layer which is in contact with said first mask layer on said silicon carbide substrate, and
forming said first source region and said second source region using said first mask layer and said second mask layer, and the step of simultaneously forming said first connection region, said first contact region, and said second contact region is performed after the step of forming said first source region and said second source region.

17. The method for manufacturing the silicon carbide semiconductor device according to claim 12, further comprising a step of forming a gate oxide film which is in contact with each of said first connection region, said first body region, and said second body region, wherein the step of forming said gate oxide film includes steps of
forming a silicon dioxide layer or a polysilicon layer on said first connection region of said silicon carbide substrate, and
performing thermal oxidation on said first main surface of said silicon carbide substrate having said silicon dioxide layer or said polysilicon layer formed thereon.

\* \* \* \* \*

UNITED STATES PATENT AND TRADEMARK OFFICE
CERTIFICATE OF CORRECTION

PATENT NO.        : 9,722,027 B2
APPLICATION NO.   : 14/909696
DATED             : August 1, 2017
INVENTOR(S)       : Toru Hiyoshi et al.

It is certified that error appears in the above-identified patent and that said Letters Patent is hereby corrected as shown below:

In the Drawings

Replace pages 1/15, 2/15, 8/15, 9/15, and 15/15 containing Figures 1-3, 12-15, and 22, with the attached Replacement Sheets 1/15, 2/15, 8/15, 9/15, and 15/15 containing Figures 1-3, 12-15, and 22.

Signed and Sealed this
Fifth Day of December, 2017

Joseph Matal
*Performing the Functions and Duties of the*
*Under Secretary of Commerce for Intellectual Property and*
*Director of the United States Patent and Trademark Office*